(12) United States Patent
Potocek et al.

(10) Patent No.: US 11,741,730 B2
(45) Date of Patent: Aug. 29, 2023

(54) CHARGED PARTICLE MICROSCOPE SCAN MASKING FOR THREE-DIMENSIONAL RECONSTRUCTION

(71) Applicant: FEI Company, Hillsboro, OR (US)

(72) Inventors: Pavel Potocek, Eindhoven (NL);
Maurice Peemen, Eindhoven (NL);
Bert Henning Freitag, Eindhoven (NL)

(73) Assignee: FEI Company, Hillsboro, OR (US)

( * ) Notice: Subject to any disclaimer, the term of this patent is extended or adjusted under 35 U.S.C. 154(b) by 72 days.

(21) Appl. No.: 17/357,900

(22) Filed: Jun. 24, 2021

(65) Prior Publication Data
US 2022/0414361 A1 Dec. 29, 2022

(51) Int. Cl.
*G06T 7/33* (2017.01)
*G06T 19/00* (2011.01)
*G06V 20/69* (2022.01)
*G06V 10/88* (2022.01)

(52) U.S. Cl.
CPC .............. *G06V 20/695* (2022.01); *G06T 7/33* (2017.01); *G06T 19/00* (2013.01); *G06V 10/92* (2022.01); *G06V 20/693* (2022.01); *G06T 2207/10061* (2013.01)

(58) Field of Classification Search
None
See application file for complete search history.

(56) References Cited

U.S. PATENT DOCUMENTS

| 8,912,491 | B2 | 12/2014 | Schoenmakers et al. | |
| 9,620,330 | B2 | 4/2017 | Potocek et al. | |
| 10,928,335 | B2 | 2/2021 | Potocek | |
| 2003/0086145 | A1* | 5/2003 | DeSimone | G02B 21/088 359/290 |
| 2009/0260883 | A1* | 10/2009 | Suarez-Rivera | G01V 11/00 175/58 |
| 2016/0370566 | A1* | 12/2016 | Palo | G02B 21/0076 |
| 2018/0254168 | A1* | 9/2018 | Henstra | H01J 37/1472 |
| 2020/0025696 | A1* | 1/2020 | Potocek | H01J 37/222 |

OTHER PUBLICATIONS

Sander, Machine translated WO 2020190136 (Year: 2020).*
(Continued)

*Primary Examiner* — Saptarshi Mazumder

(57) ABSTRACT

Disclosed herein are CPM support systems, as well as related apparatuses, methods, computing devices, and computer-readable media. For example, in some embodiments, a charged particle microscope computational support apparatus may include: first logic to, for each angle of a plurality of angles, receive an associated image of a specimen at the angle, and generate an associated scan mask based on one or more regions-of-interest in the associated image; second logic to, for each angle of the plurality of angles, generate an associated data set of the specimen by processing data from a scan, in accordance with the associated scan mask, by a charged particle microscope of the specimen at the angle; and third logic to provide, for each angle of the plurality of angles, the associated data set of the specimen to reconstruction logic to generate a three-dimensional reconstruction of the specimen.

20 Claims, 6 Drawing Sheets

(56) References Cited

OTHER PUBLICATIONS

J.M. Lebeau, S. D. Findlay, L. J. Allen, and S. Stemmer, Position Averaged Convergent Beam Electron Diffraction, Microsc Microanal 15 (Suppl 2), 2009, pp. 494-495, Microscopy Society of America.
Christopher G. Jones, Michael W. Martynowycz, Johan Hattne, Tyler J. Fulton, Brian M. Stoltz, Jose A. Rodriguez, Hosea M. Nelson, and Tamir Gonen, The CryoEM Method MicroED as a Powerful Tool for Small Molecule Structure Determination, ACS Cent Sci, 2018, 4, 1587-1592.
Automated Particle Analysis at the Nanoscale, Thermo Fisher Scientific website, https://www.thermofisher.com/us/en/home/materials-science/automated-nanoparticle-workflow.html. Accessed May 17, 2021.

* cited by examiner

CHARGED PARTICLE MICROSCOPE SCAN MASKING FOR THREE-DIMENSIONAL RECONSTRUCTION

BACKGROUND

Microscopy is the technical field of using microscopes to better view objects that are difficult to see with the naked eye. Different branches of microscopy include, for example, optical microscopy, charged particle (e.g., electron and/or ion) microscopy, and scanning probe microscopy. Charged particle microscopy involves using a beam of accelerated charged particles as a source of illumination. Types of charged particle microscopy include, for example, transmission electron microscopy, scanning electron microscopy, scanning transmission electron microscopy, and ion beam microscopy.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1:
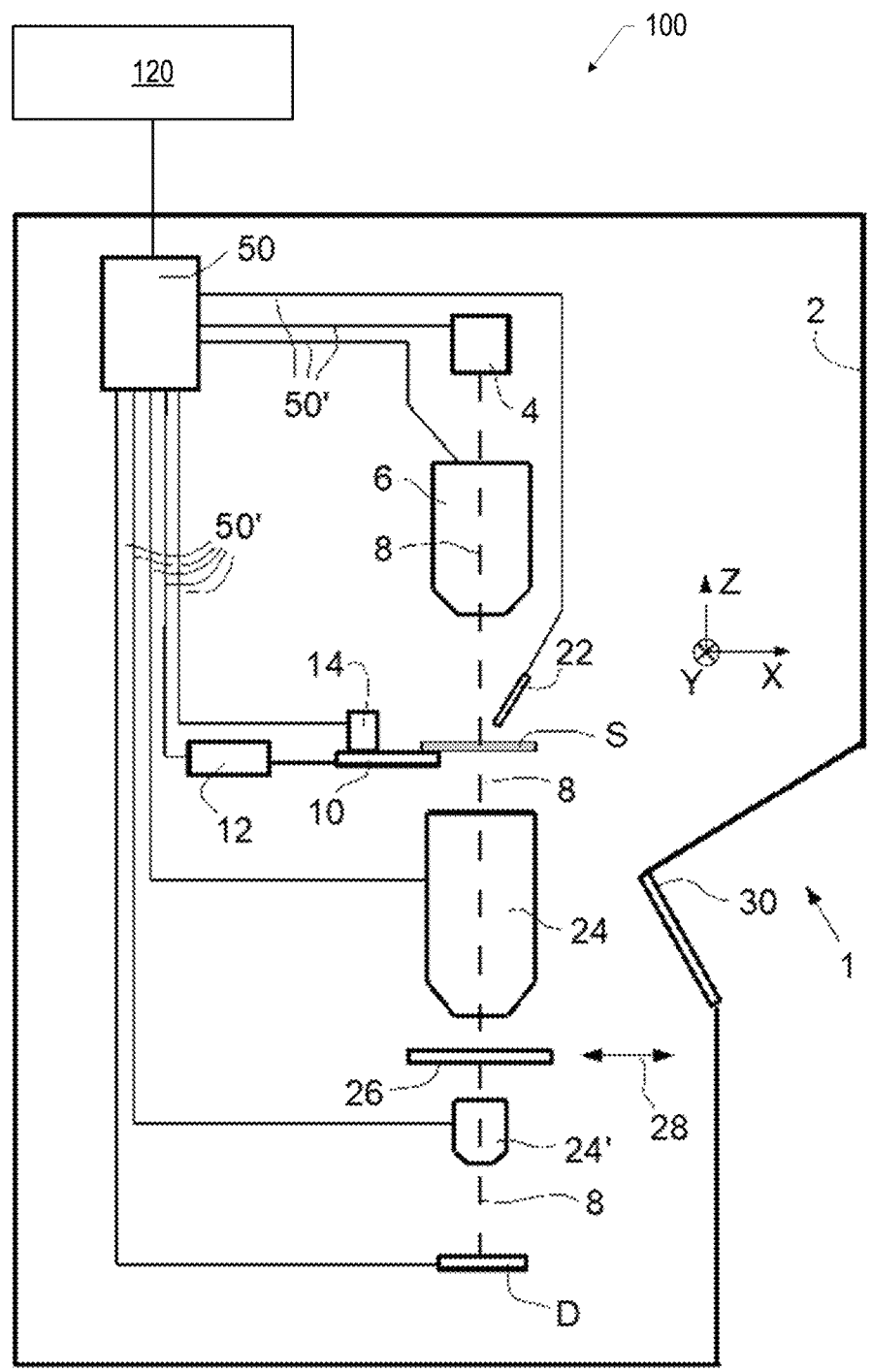
FIG. 1 illustrates a charged particle microscope (CPM) system configured for scan masking for three-dimensional reconstruction, in accordance with various embodiments.

Disclosed herein are charged particle microscope (CPM) support systems, as well as related apparatuses, methods, computing devices, and computer-readable media. For example, in some embodiments, a charged particle microscope computational support apparatus may include: first logic to, for each angle of a plurality of angles, receive an associated image of a specimen at the angle, and generate an associated scan mask based on one or more regions-of-interest in the associated image; second logic to, for each angle of the plurality of angles, generate an associated data set of the specimen by processing data from a scan, in accordance with the associated scan mask, by a charged particle microscope of the specimen at the angle; and third logic to provide, for each angle of the plurality of angles, the associated data set of the specimen to reconstruction logic to generate a three-dimensional reconstruction of the specimen.

Conventional three-dimensional analytical tomography typically includes repeated acquisition of a full-frame CPM image, as well as a full-frame analytical measurement mapping, for multiple tilt angles of the specimen. The full-frame analytical data may be quantified to identify individual material components, resulting in a tilt series of full-frame images for the individual material components. Conventional tomography reconstruction algorithms may be applied to the full-frame CPM images and the full-frame images for the individual material components to create CPM and analytical volume data. This conventional approach may suffer from a number of constraints and limitations. For example, conventional acquisition of analytical signals of a specimen during charged particle microscopy (e.g., using energy-dispersive spectroscopy (EDS) or electron energy loss spectroscopy (EELS)) is an extremely slow process and typically requires a high radiation dose be delivered to the specimen, which may result in specimen damage. When these analytical signals are acquired for the purposes of three-dimensional reconstruction (e.g., three-dimensional analytical particle investigation with scanning transmission electron microscopy tomography), the acquisition time and/or the specimen dose may be enormous unless the size of the investigated region (e.g., the number of investigated particles) is kept extremely small (and thus the amount of statistical information about particle composition and spatial distribution in the specimen is extremely limited).

The CPM reconstruction support embodiments disclosed herein may achieve improved performance relative to conventional approaches. For example, in some embodiments, a "high resolution" analytical acquisition at each tilt angle may be selectively performed in accordance with a scan mask created from an initial "low-resolution" image. In such embodiments, the radiation dose provided to a specimen may be lower than the dose provided during a full-frame analytical acquisition (e.g., because "irrelevant" regions of the specimen may not be irradiated, thereby mitigating overall damage) and the time required for acquisition may be significantly less than the time required for a full-frame analytical acquisition. In some particular embodiments, an improvement of more than one order of magnitude in acquisition time and/or radiation dose may be achieved. In some embodiments, after a selective analytical acquisition, the results of spectral quantification (e.g., energy-dispersive x-ray spectroscopy (EDX) data) for a particular tilt angle may be inserted into the correct locations of an empty full-frame image, and the resulting images for multiple tilt angles may be provided to a standard reconstruction workflow (e.g., a standard tomography reconstruction workflow) to achieve a successful three-dimensional reconstruction of the specimen. This result is contrary to the conventional assumption that full-frame images without zero-data regions are required for successful three-dimensional reconstruction, and thus the CPM reconstruction support embodiments disclosed herein represent a significant advance over conventional approaches. The embodiments disclosed herein thus provide substantial improvements to CPM technology (e.g., improvements in the computer technology supporting CPMs, among other improvements).

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the subject matter disclosed herein. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrases "A and/or B" and "A or B" mean (A), (B), or (A and B). For the purposes of the present disclosure, the phrases "A, B, and/or C" and "A, B, or C" mean (A), (B), (C), (A and B), (A and C), (B and C), or (A, B, and C). Although some elements may be referred to in the singular (e.g., "a processing device"), any appropriate elements may be represented by multiple instances of that element, and vice versa. For example, a set of operations described as performed by a processing device may be implemented with different ones of the operations performed by different processing devices.

The description uses the phrases "an embodiment," "various embodiments," and "some embodiments," each of which may refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y. As used herein, an "apparatus" may refer to any individual device, collection of devices, part of a device, or collections of parts of devices. The drawings are not necessarily to scale.

FIG. 1 depicts an embodiment of a CPM system 100 including a CPM 1 coupled to a display device 120. The CPM 1 may include any suitable type of CPM, such as a transmission electron microscope (TEM), a scanning electron microscope (SEM), a scanning transmission electron microscope (STEM), a cryo-electron microscope (cryoEM), or an ion beam microscope. The CPM 1 may include an enclosure 2 having a charged particle source 4 therein. In some embodiments, the enclosure 2 may be a vacuum enclosure, while in other embodiments, a particular gaseous environment may be maintained within the enclosure 2 (e.g., for "environmental STEM" applications). The charged particle source 4 may be, for example, an electron source (e.g., a Schottky gun), a positive ion source (e.g., a gallium ion source or a helium ion source), a negative ion source, a proton source, or a positron source. The charged particle source 4 may produce a beam of charged particles that traverses an illuminator 6 that directs and/or focuses the particles onto a region of a specimen S. The illuminator 6 may also perform aberration mitigation, cropping, and/or filtering of the charged particles output by the charged particle source 4. The illuminator 6 may have an axis 8, and may include one or more sub-components, such as electrostatic lenses, magnetic lenses, scan deflectors, correctors (e.g., stigmators), and/or a condenser system.

The specimen S may be held on a specimen holder 10 that can be positioned in multiple degrees of freedom by a positioning device 12. For example, the specimen holder 10 may include a finger that can be translated in the x-y plane and may also be rotated about an axis in the x-y plane to achieve different tilt angles of the specimen with respect to the axis 8 of the beam of charged particles from the illuminator 6. Such movement may allow different regions of the specimen S to be irradiated, scanned, and/or inspected at different angles by the charged particle beam traveling along axis 8 (and/or may allow scanning motion to be performed, as an alternative to beam scanning). A cooling device 14 may be in thermal contact with the specimen holder 10, and may be capable of maintaining the specimen holder 10 at cryogenic temperatures (e.g., using a circulating cryogenic coolant to achieve and maintain a desired low temperature) when desired.

The focused charged particle beam, traveling along axis 8, may interact with the specimen S in such a manner as to cause various types of radiation to emanate from the specimen S. Such radiation may include secondary charged particles (e.g., secondary electrons), backscattered charged particles (e.g., backscattered electrons), x-rays, and/or optical radiation (e.g., cathodoluminescence). One or more of these radiation types, or other radiation types, may be detected by a detector 22. In some embodiments, the detector 22 may include a combined scintillator/photomultiplier or EDX detector, for example. Alternately or additionally, charged particles may traverse the specimen S, emerge from it, and continue to propagate (substantially, though generally with some deflection/scattering) along axis 8. Such transmitted electrons may enter an imaging system 24 that serves as a combined objective/projection lens and which may include a variety of electrostatic and/or magnetic lenses, deflectors, correctors (e.g., stigmators), etc., as suitable. In a non-scanning mode, the imaging system 24 may focus the transmitted electrons onto a fluorescent screen 26 which, if desired, can be retracted or otherwise withdrawn (as schematically indicated by arrows 28) so as to move it out of the way of the axis 8. An image of a portion of the specimen S may be formed by the imaging system 24 on the screen 26, and this may be viewed through the viewing port 30 located in a suitable portion of the enclosure 2 of the CPM 1. The retraction mechanism for the screen 26 may, for example, be mechanical and/or electrical in nature, and is not depicted here.

Alternatively or additionally to viewing an image on a screen 26, a charged particle detector D may be used. In such embodiments, an adjuster lens 24' may shift the focus of the charged particles emerging from the imaging system 24 and redirect them onto the charged particle detector D (rather than onto the plane of the retracted screen 26, as discussed above). At the charged particle detector D, the charged particles may form an image (e.g., a diffractogram) that can be processed by the controller 50 and displayed on the display device 120. In STEM mode, an output from the detector D can be recorded as a function of the (x,y) scanning beam position and tilt angle of the specimen S, and an image can be constructed that is a map of the detector output. Generally, a CPM 1 may include one or more detectors arranged as desired; examples of such detectors may include photomultipliers (e.g., solid-state photomultipliers), photodiodes, complementary metal oxide semiconductor (CMOS) detectors, charge-coupled device (CCD) detectors, and photovoltaic cells used in conjunction with a scintillator film, among others. The present disclosure will use the term "image" to refer to a set of data generated by one or more detectors of a CPM, and such images may include a scalar value at each pixel, a vector value at each pixel, or any other suitable arrangement of information.

The controller 50 may be connected to various illustrative components via control lines 50' (e.g., buses). The controller 50 may provide a variety of functions, such as synchronizing actions, providing setpoints, processing signals, performing calculations, and displaying messages/information on the display device 120. Although the controller 50 is depicted in FIG. 1 as being inside an enclosure 2 of the CPM 1, this is simply illustrative, and the controller 50 may be located inside the enclosure 2, outside the enclosure 2, or may be distributed between components inside the enclosure 2 and outside the enclosure 2. For example, in some embodiments, some operations of the controller 50 may be performed by hardware located inside the enclosure 2, while other operations of the controller 50 may be performed by hardware (e.g., a computing device, such as a laptop or desktop computer) located outside the enclosure 2.

Figure 2:
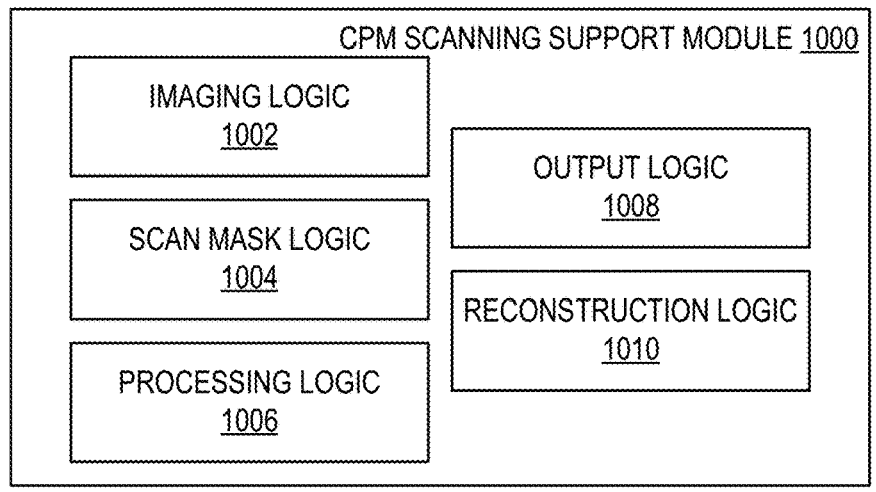
FIG. 2 is a block diagram of an example CPM reconstruction support module for performing reconstruction support operations, in accordance with various embodiments.

FIG. 2 is a block diagram of a CPM reconstruction support module 1000 for performing reconstruction support operations, in accordance with various embodiments. The CPM reconstruction support module 1000 may be part of the controller 50 of the CPM system 100 of FIG. 1. The CPM reconstruction support module 1000 may be implemented by circuitry (e.g., including electrical and/or optical components), such as a programmed computing device. The logic of the CPM reconstruction support module 1000 may be included in a single computing device, or may be distributed across multiple computing devices that are in communication with each other as appropriate. Examples of computing devices that may, singly or in combination, implement the CPM reconstruction support module 1000 are discussed herein with reference to the computing device 4000 of FIG. 6, and examples of systems of interconnected computing devices, in which the CPM reconstruction support module 1000 may be implemented across one or more of the computing devices, is discussed herein with reference to the CPM support system 5000 of FIG. 7.

The CPM reconstruction support module 1000 may include imaging logic 1002, scan mask logic 1004, processing logic 1006, output logic 1008, and reconstruction logic 1010. As used herein, the term "logic" may include an apparatus that is to perform a set of operations associated with the logic. For example, any of the logic elements included in the CPM reconstruction support module 1000 may be implemented by one or more computing devices programmed with instructions to cause one or more processing devices of the computing devices to perform the associated set of operations. In a particular embodiment, a logic element may include one or more non-transitory computer-readable media having instructions thereon that, when executed by one or more processing devices of one or more computing devices, cause the one or more computing devices to perform the associated set of operations. As used herein, the term "module" may refer to a collection of one or more logic elements that, together, perform a function associated with the module. Different ones of the logic elements in a module may take the same form or may take different forms. For example, some logic in a module may be implemented by a programmed general-purpose processing device, while other logic in a module may be implemented by an application-specific integrated circuit (ASIC). In another example, different ones of the logic elements in a module may be associated with different sets of instructions that may be executed by one or more processing devices. A module may not include all of the logic elements depicted in the associated drawing; for example, a module may include a subset of the logic elements depicted in the associated drawing when that module is to perform a subset of the operations discussed herein with reference to that module.

Figure 4A:
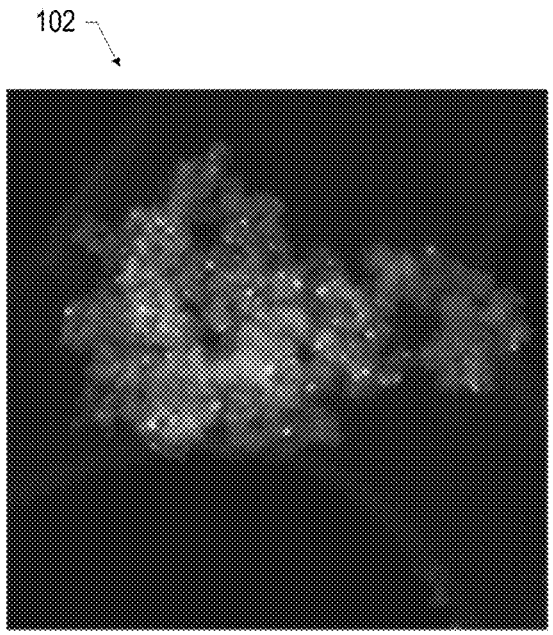
FIGS. 4A-4H illustrate various computational outputs and displays that may be part of the performance of some or all of the CPM reconstruction support methods disclosed herein, in accordance with various embodiments.

The imaging logic 1002 may cause a CPM (e.g., the CPM 1 of FIG. 1) to generate an image of a specimen (e.g., the specimen S of FIG. 1) at a particular angle (e.g., a particular tilt angle), and to do so for multiple different angles. The imaging logic 1002 may be configurable so as to capture different types of images. For example, in some embodiments, the imaging logic 1002 may be configurable to capture low-resolution images and high-resolution images. A low-resolution image of a specimen may require a lower radiation dose and/or acquisition time then a high-resolution image of the specimen. In some embodiments, as discussed further below, the imaging logic 1002 may cause a CPM to generate a low-resolution image of a specimen at an angle, then that low-resolution image may be used (e.g., by the scan mask logic 1004) to generate a scan mask that will be applied when the imaging logic 1002 causes the CPM to generate a high-resolution image of the specimen at the angle, such that only a subset of the field-of-view of the CPM is captured at high resolution. In some embodiments, the images generated by a CPM at the instruction of the imaging logic 1002 may include bright-field images, annular bright-field (ABF) images, integrated differential phase contrast (iDPC) images, or high-angle annular dark-field (HAADF) images. FIG. 4A depicts a graphical representation 102 of an image (e.g., a "low-resolution" image) of a specimen that may be generated by the imaging logic 1002. The particular graphical representation 102 of FIG. 4A is a HAADF image, but the imaging logic 1002 may generate any suitable images.

The scan mask logic 1004 may receive (e.g., from the imaging logic 1002) an image of a specimen (e.g., the specimen S of FIG. 1) at a particular angle (e.g., a particular tilt angle) and may generate an associated scan mask for later imaging by the CPM (e.g., the CPM 1 of FIG. 1) based on the received image; the scan mask logic 1004 may do so for multiple different angles. As used herein, a "scan mask" may be a data set that indicates to a CPM (e.g., the CPM 1 of FIG. 1) which regions in its total field-of-view are to be imaged in a later imaging operation. For example, a scan mask may indicate which of the squares in a "full-frame" grid of the field-of-view are to be imaged in a later imaging operation. A scan mask may thus correspond to a subset of the full-frame field-of-view of a CPM. In some embodiments, the scan mask logic 1004 may identify regions-of-interest in a received, lower-resolution image, and may generate a scan mask that identifies the regions-of-interest as regions that are to be scanned in a later, higher-resolution imaging operation of the CPM. The scan mask logic 1004 may identify the regions-of-interest in a received image using any of a number of image processing techniques whose selection may depend on the particular features of interest in the specimen. For example, in a particle detection setting, the regions-of-interest may include the individual particles in an image of the specimen, as well as the neighboring pixels. The scan mask logic 1004 may identify regions-of-interest in other settings as well, such as for precipitate detection, grain boundary detection, or cell membrane detection, among others. Any of a number of well-known image processing techniques may be used to generate regions-of-interest in an image of particles or other features, such as centroid-finding techniques (e.g., a Crocker-Grieg centroid-finding technique), thresholding techniques, attention-based transformer network techniques, or neural network techniques.

The scan mask generated by the scan mask logic 1004 may indicate to the CPM that the portions of its field-of-view corresponding to the regions-of-interest are to be imaged in a later imaging operation, and the portions of its field-of-view not corresponding to the regions-of-interest are not to be imaged in the later imaging operation. Reducing the area of the field-of-view that is to be imaged may reduce the radiation to which the specimen is exposed and may reduce the acquisition time of the later imaging operation, relative to an imaging operation which the entire field-of-view is imaged. In some embodiments, the scan mask generated by the scan mask logic may have a greater resolution than the image used by the scan mask logic 1004 to generate the scan mask.

Figure 4B:
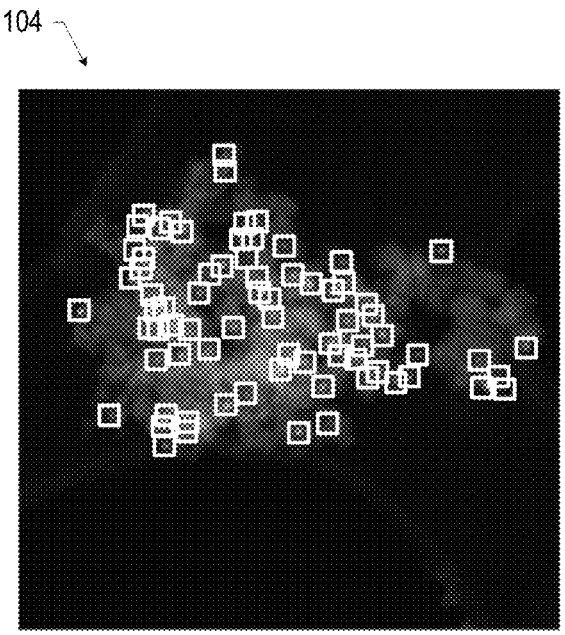

FIG. 4B depicts a graphical representation 104 of an example set of regions-of-interest (bounded by white squares) that the scan mask logic 1004 may identify in the graphical representation 102 of FIG. 4A; in the graphical representation 104, the regions-of-interest are overlaid on the graphical representation 102 (FIG. 4A). The regions-of-interest may center on or otherwise include likely particles or other features-of-interest in the graphical representation 102, and the scan mask logic may identify the regions-of-interest through application of any of the techniques discussed above (e.g., a centroid-finding technique). Although the regions-of-interest depicted in the graphical representation 104 of FIG. 4B have square boundaries, this need not be the case, and in other embodiments, the regions-of-interest may have other rectangular boundaries, rounded rectangular boundaries (e.g., substantially rectangular boundaries with rounded corners and/or edges), non-rectangular boundaries (e.g., circular or hexagonal boundaries), or other suitably shaped boundaries.

Figure 4C:
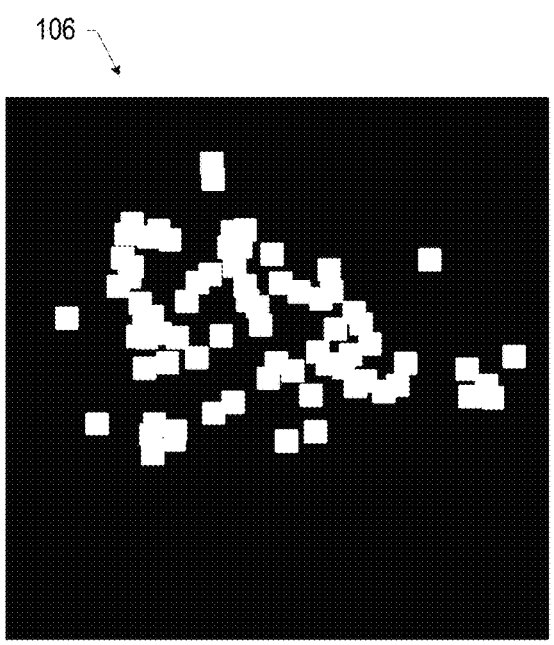

FIG. 4C depicts a graphical representation 106 of an example scan mask, associated with the regions-of-interest of the graphical representation 104 (FIG. 4B), that may be generated by the scan mask logic 1004. In the graphical representation 106, the areas in white indicate the areas in a CPM's field-of-view that will be imaged in a later scan, and the areas in black indicate the areas in the CPM's field-of-view that will not be imaged in the later scan. The white areas in the graphical representation 106 correspond to the union of the regions-of-interest in the graphical representation 104 of FIG. 4B, although in some embodiments, the scan mask associated with a set of regions-of-interest may be larger than the union of the regions-of-interest (e.g., by a fixed number or percentage of pixels). Note that the graphical representations 104 and 106 of FIG. 4A and FIG. 4B, respectively, are each associated with the angle at which the specimen was imaged to generate the graphical representation 102 of FIG. 4A; graphical representations like the graphical representations 104 and 106 may be generated for each of multiple angles at which the specimen is imaged.

The processing logic 1006 may generate a data set representative of the specimen (e.g., the specimen S of FIG. 1) and associated with a particular angle by processing a scan, in accordance with the scan mask generated by the scan mask logic 1004, by a CPM (e.g., the CPM 1 of FIG. 1) at the angle. The scan by the CPM, on which the data set generated by the processing logic 1006 is based, may be a higher-resolution scan than the scan performed to generate the associated image on which the scan mask (generated by the scan mask logic 1004) was based. In particular, the imaging logic 1002 may cause a low-resolution image of the specimen at an angle to be generated by a CPM, the scan mask logic 1004 may use that low-resolution image of the specimen at the angle to generate a scan mask, the imaging logic 1002 may cause a high-resolution image of the specimen at the angle to be generated by the CPM in accordance with the scan mask, and the processing logic 1006 may generate a data set of the specimen at the angle based on the high-resolution image. Thus, for a particular specimen and a particular angle, the imaging logic 1002 may cause the CPM to generate two images: an initial low-resolution image to be used by the scan mask logic 1004 to generate a scan mask, and a later high-resolution image, captured in accordance with the scan mask, to be used by the processing logic 1006 to generate a data set representative of the specimen at the angle. In some embodiments, the imaging logic 1002 may perform an initial round of image capture by causing the CPM to generate images (e.g., low-resolution images) of the specimen at multiple different angles, after which the scan mask logic 1004 may generate a scan mask associated with each angle based on the associated image. Once the scan mask associated with each angle has been generated, the imaging logic 1002 may perform a second round of image capture by causing the CPM to generate images (e.g., high-resolution images) of the specimen at multiple different angles in accordance with the associated scan masks. The processing logic 1006 may then process the images from this second round of imaging to generate the data sets associated with each angle. In some embodiments, the data sets generated by the processing logic 1006 may themselves be considered "high-resolution" images.

In some embodiments, the processing performed by the processing logic 1006 on the output of a scan of the specimen by a CPM in accordance with the scan mask may include storing the output of the scan. In some embodiments, the processing performed by the processing logic 1006 on the output of a scan by a CPM in accordance with the scan mask may include filtering the output of the scan. For example, the processing logic 1006 may apply a Gaussian spatial filter to the output of a scan to mitigate noise. In some embodiments, the processing performed by the processing logic 1006 on the output of a scan by a CPM in accordance with the scan mask may include aligning the outputs associated with different angles. For example, the processing logic 1006 may compare the outputs of scans associated with different angles and may shift the data of each scan to better align the features in the scans to compensate for drift in the specimen, using any suitable techniques known in the art. The processing logic 1006 may perform any combination of these operations (e.g., storing, filtering, and aligning) in any desired order as part of processing data from "masked" scans, and thus the processing logic 1006 may thus generate a data set of the specimen associated with each angle.

As noted above, a particular angle, the "initial" image of the specimen used to generate a scan mask may be a lower resolution data set than the "later" data set generated by the processing logic 1006. That is, the scanning technique used to generate the "initial" image of the specimen may involve a lower radiation dose and/or may require a shorter acquisition time than the scanning technique performed to supply the data for the "later" data set. In some embodiments, the "initial" image of the specimen may be a HAADF image or other CPM image, while the scanning technique performed to supply the data for the "later" data set may include an analytical acquisition technique, such as an electron diffraction technique, EDS, and/or EELS. Such analytical data may include, for example, a two-dimensional array of data, or a higher dimensional array of data, associated with each location of the specimen at the angle. The data sets generated by the processing logic 1006 may thus, in some embodiments, include electron diffraction data (e.g., position-averaged convergent beam electron diffraction (PACBED) data), EDS data and/or EELS data.

In some embodiments in which electron diffraction data is included in the data sets generated by the processing logic 1006, a summed diffraction pattern may be recorded at each angle as part of the acquisition of analytical data, and these summed diffraction patterns may be added up for each region across all angles, resulting in an electron diffraction pattern that can be provided to the reconstruction logic 1010 (discussed below) to determine a crystal structure of the specimen. In some embodiments in which a PACBED pattern is recorded, the diffraction patterns may not be averaged, but may be stored individually, and, per angle, electric and/or magnetic fields may be determined by measuring the shift of the diffraction pattern or identifying the shift of the center of mass of the central disk; in combination with the angles, this information may be used by the reconstruction logic 1010 (Discussed below) to determine a three-dimensional electric and/or magnetic field distribution in the specimen. In embodiments in which a PACBED pattern is recorded, the process of multiple particle three-dimensional structural analysis with discrete or continuous tilt diffractions tomograms may be accelerated, relative to conventional approaches. In some embodiments, the data sets generated by the processing logic 1006 may include spectral information (e.g., emission spectra generated by EDS that allow elemental analysis or other chemical characterization). In some embodiments, the data sets generated by the processing logic 1006 may include cathodoluminescence (CL) data, Raman imaging data, Auger electron spectroscopy (ASE) data, back-scattered electron (BSE) data, secondary electron (SE) data, colorSEM data, or data acquired in any multi-modal acquisition scheme that can be used to obtain information about the three-dimensional structure of a specimen (e.g., three-dimensional electric field mapping, three-dimensional electronic structure, information about three-dimensional surface roughness, etc.).

Figure 4D:
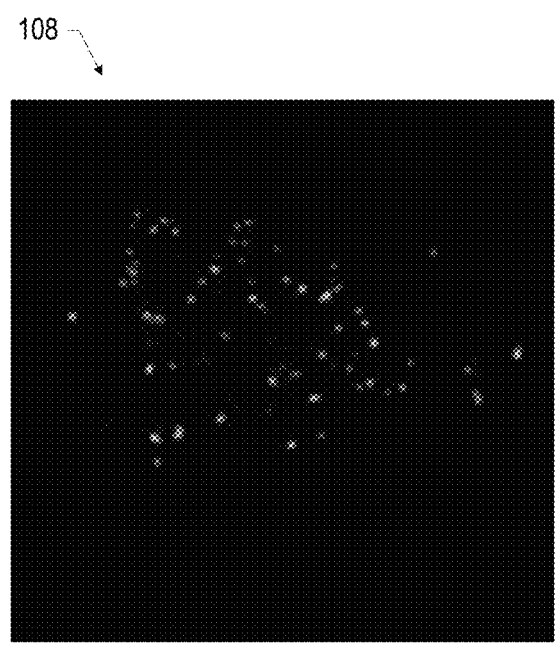

FIG. 4D depicts a graphical representation 108 of a data set generated by the processing logic 1006 by processing data from a scan by a CPM of a specimen at the same angle as the angle used to generate the graphical representation 102 (FIG. 4A). The graphical representation 108 may be a higher-resolution representation than the graphical representation 102, and may indicate the location of particular elements or other types of particles in the specimen (as a result of analytical data generated during analytical acquisition of the specimen in accordance with the scan mask generated by the scan mask logic 1004). In some embodiments, the graphical representation 108 may indicate the locations of a single element (e.g., gold or palladium), while in other embodiments, the graphical representation 108 may use multiple colors to indicate the locations of multiple elements (e.g., with different elements depicted in different colors, not shown).

Figure 4E:
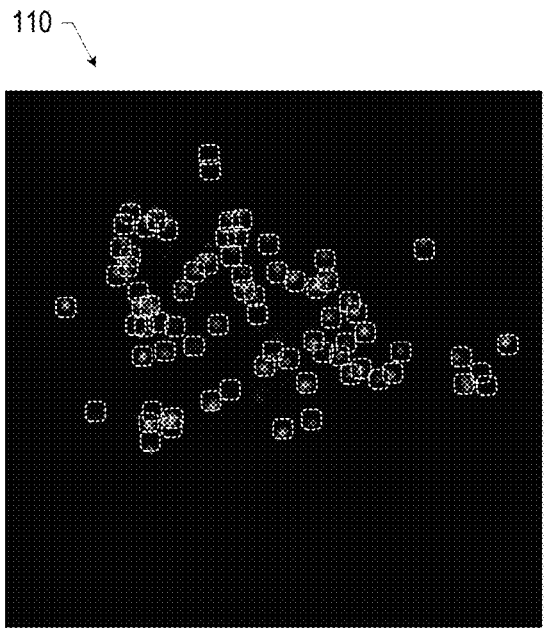

As discussed above, the data sets generated by the processing logic 1006 may be based on scans performed in accordance with scan masks generated by the scan mask logic 1004. These scans may generate data for some areas (e.g., the white areas in the graphical representation of FIG. 4C) and may not generate data for other areas (e.g., the black areas in the graphical representation of FIG. 4C). Thus, the data sets generated by the processing logic 1006 may include non-zero data regions (corresponding to imaged areas) and zero data regions (corresponding to non-imaged areas). For example, the data set generated by the processing logic 1006 for a particular angle may include the results of spectral quantification of the specimen for that particular angle inserted into the correct locations of an empty full-frame image. Some of the processing operations performed by the processing logic 1006 on the data generated from a scan may result in a blurring or shifting of the non-zero data regions/zero data regions relative to the imaged regions/non-imaged regions (e.g., filtering the data from a scan may result in non-zero data values being present in regions that were not imaged), but the boundaries of the non-zero data regions may generally correspond to the boundaries of the regions-of-interest/imaged regions, as discussed above (e.g., the boundaries of the non-zero data regions may be square, other rectangular, rounded, etc.). For example, FIG. 4E depicts a graphical representation 110 of the data set illustrated in the graphical representation 108 of FIG. 4D, but with boundaries (e.g., substantially rectangular boundaries that are rounded and/or noisy) of the non-zero data regions depicted as dotted rectangles; the area outside the non-zero data regions may be zero data regions.

The output logic 1008 may provide the data sets generated by the processing logic 1006 for further processing by reconstruction logic 1010. In some embodiments, the output logic 1008 may provide the data sets directly to the reconstruction logic 1010 (e.g., when the output logic 1008 and the reconstruction logic 1010 are implemented as part of a common software package and/or execute on a common computing device), while in other embodiments, the output logic 1008 may provide the data sets in an intermediate form that can be provided later to the reconstruction logic 1010. An example of this latter embodiment may include the output logic 1008 exporting the data sets to a storage device (e.g., networked storage or a physical storage device, such as a Universal Serial Bus (USB) stick) that can be later accessed by the reconstruction logic 1010. In some embodiments, the processing logic 1006 may be included in a software package that is separate from a software package that includes the reconstruction logic 1010.

The reconstruction logic 1010 may use the data sets generated by the processing logic 1006 to generate a three-dimensional reconstruction of the specimen. The reconstruction logic 1010 may use any suitable known techniques for this reconstruction. For example, in various embodiments, the reconstruction logic 1010 may use the data sets to perform a tomographic reconstruction, a weighted back projection (WBP), a simultaneous iterative reconstruction technique (SIRT), a HAADF-energy dispersive spectroscopy (EDS) bimodal tomography (HEBT) technique, a conjugate gradient least squares (CGLS) technique, an expectation maximization (EM) technique, a simultaneous algebraic reconstruction technique (SART), a diffraction tomography technique, or a combination thereof. In some embodiments, the reconstruction logic 1010 may generate a crystal structure of the specimen as part of the three-dimensional reconstruction. In some embodiments, the reconstruction logic 1010 may operate, in conjunction with the other logic of the CPM reconstruction support module 1000, to completely automatically find a certain number of particles in a specimen and determine their three-dimensional structure, composition, and morphology.

Figure 3:
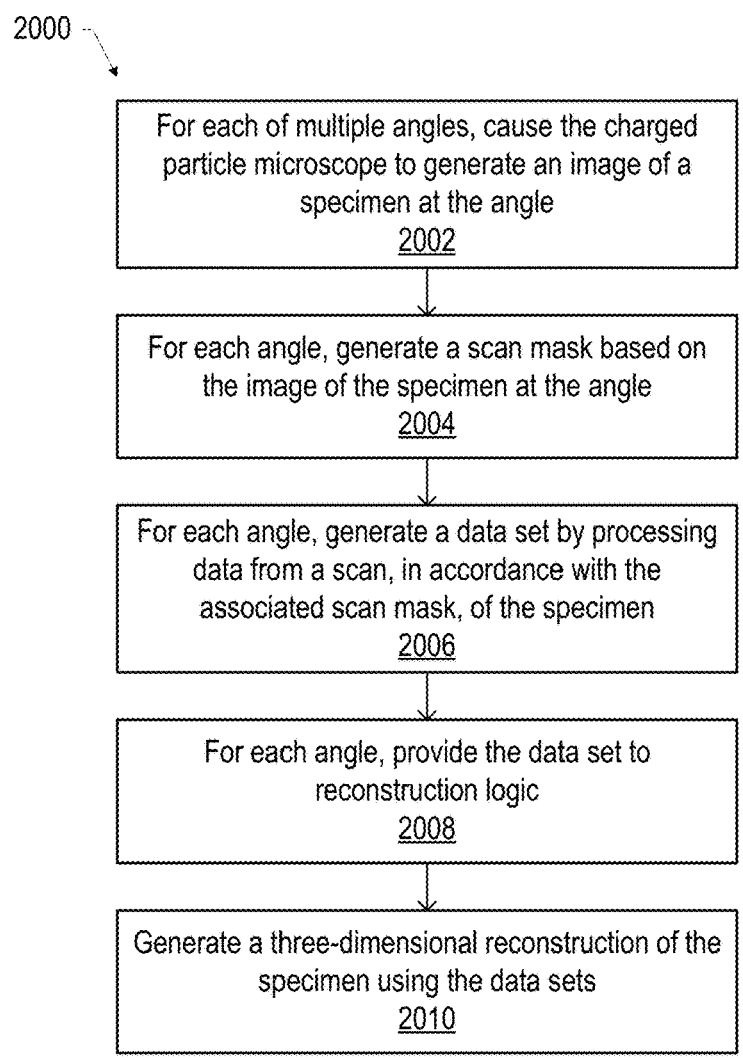
FIG. 3 is a flow diagram of an example method of performing reconstruction support operations, in accordance with various embodiments.

FIG. 3 is a flow diagram of a method 2000 of performing reconstruction support operations, in accordance with various embodiments. Although the operations of the method 2000 may be illustrated with reference to particular embodiments disclosed herein (e.g., the CPM reconstruction support modules 1000 discussed herein with reference to FIG. 2), the method 2000 may be used in any suitable setting to perform any suitable reconstruction support operations.

Operations are illustrated once each and in a particular order in FIG. 3, but the operations may be reordered and/or repeated as desired and appropriate (e.g., different operations performed may be performed in parallel, as suitable).

At 2002, for each of multiple angles, a CPM may be caused to generate an image of a specimen at the angle. For example, the imaging logic 1002 of a CPM reconstruction support module 1000 may perform the operations of 2002. The operations of 2002 may include any suitable ones of the operations discussed above with reference to the imaging logic 1002 and/or any other suitable operations.

At 2004, for each angle, a scan mask may be generated based on the image of the specimen at the angle (generated at 2002). For example, the scan mask logic 1004 of a CPM reconstruction support module 1000 may perform the operations of 2004. The operations of 2004 may include any suitable ones of the operations discussed above with reference to the scan mask logic 1004 and/or any other suitable operations.

At 2006, for each angle, a data set may be generated by processing data from a scan (e.g., an analytical acquisition to generate electrical, magnetic, elemental, or chemical characterization information), in accordance with the associated scan mask, of the specimen. For example, the processing logic 1006 of a CPM reconstruction support module 1000 may perform the operations of 2006. The operations of 2006 may include any suitable ones of the operations discussed above with reference to the processing logic 1006 and/or any other suitable operations.

At 2008, for each angle, the data sets (generated at 2006) may be provided to reconstruction logic. For example, the output logic 1008 of a CPM reconstruction support module 1000 may perform the operations of 2008. The operations of 2008 may include any suitable ones of the operations discussed above with reference to the output logic 1008 and/or any other suitable operations.

At 2010, a three-dimensional reconstruction of the specimen may be generated using the data sets (provided at 2008). For example, the reconstruction logic 1010 of a CPM reconstruction support module 1000 may perform the operations of 2010. The operations of 2010 may include any suitable ones of the operations discussed above with reference to the reconstruction logic 1010 and/or any other suitable operations.

Figure 6:
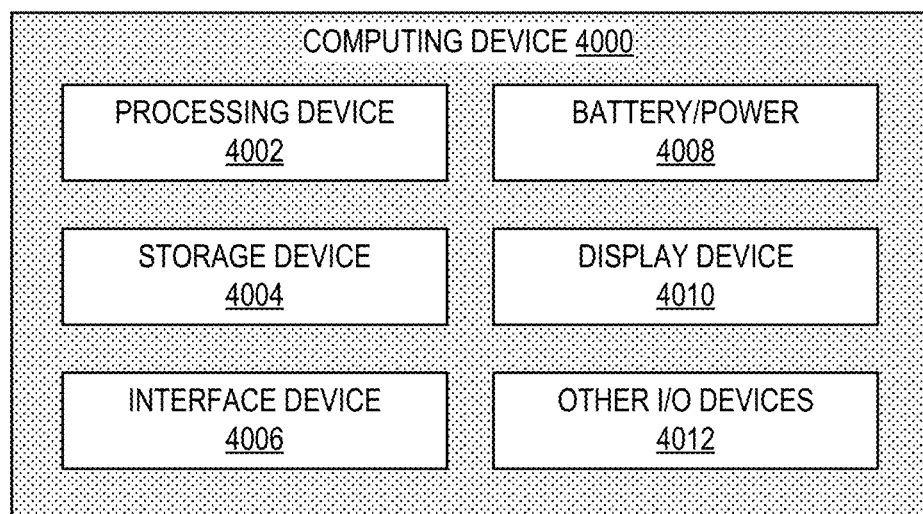
FIG. 6 is a block diagram of an example computing device that may perform some or all of the CPM reconstruction support methods disclosed herein, in accordance with various embodiments.
Figure 7:
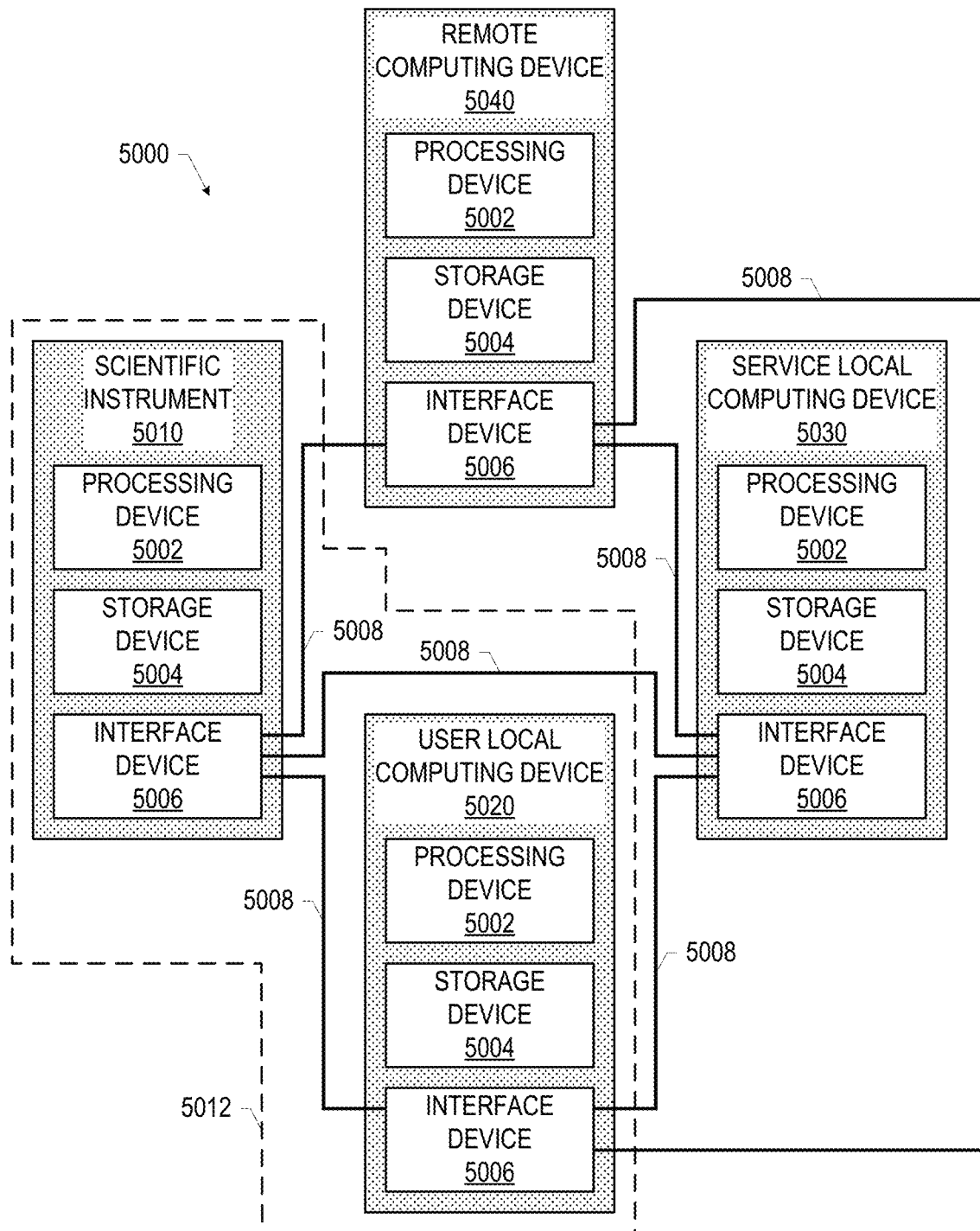
FIG. 7 is a block diagram of an example CPM support system in which some or all of the CPM reconstruction support methods disclosed herein may be performed, in accordance with various embodiments.

The CPM reconstruction support methods disclosed herein may include interactions with a human user (e.g., via the user local computing device 5020 discussed herein with reference to FIG. 7). These interactions may include providing information to the user (e.g., information regarding the operation of a CPM such as the CPM 5010 of FIG. 7, information regarding a specimen being analyzed or other test or measurement performed by a CPM, information retrieved from a local or remote database, or other information) or providing an option for a user to input commands (e.g., to control the operation of a CPM such as the CPM 5010 of FIG. 7, or to control the analysis of data generated by a CPM), queries (e.g., to a local or remote database), or other information. In some embodiments, these interactions may be performed through a graphical user interface (GUI) that includes a visual display on a display device (e.g., the display device 4010 discussed herein with reference to FIG. 6) that provides outputs to the user and/or prompts the user to provide inputs (e.g., via one or more input devices, such as a keyboard, mouse, trackpad, or touchscreen, included in the other I/O devices 4012 discussed herein with reference to FIG. 6). The CPM support systems disclosed herein may include any suitable GUIs for interaction with a user.

Figure 5:
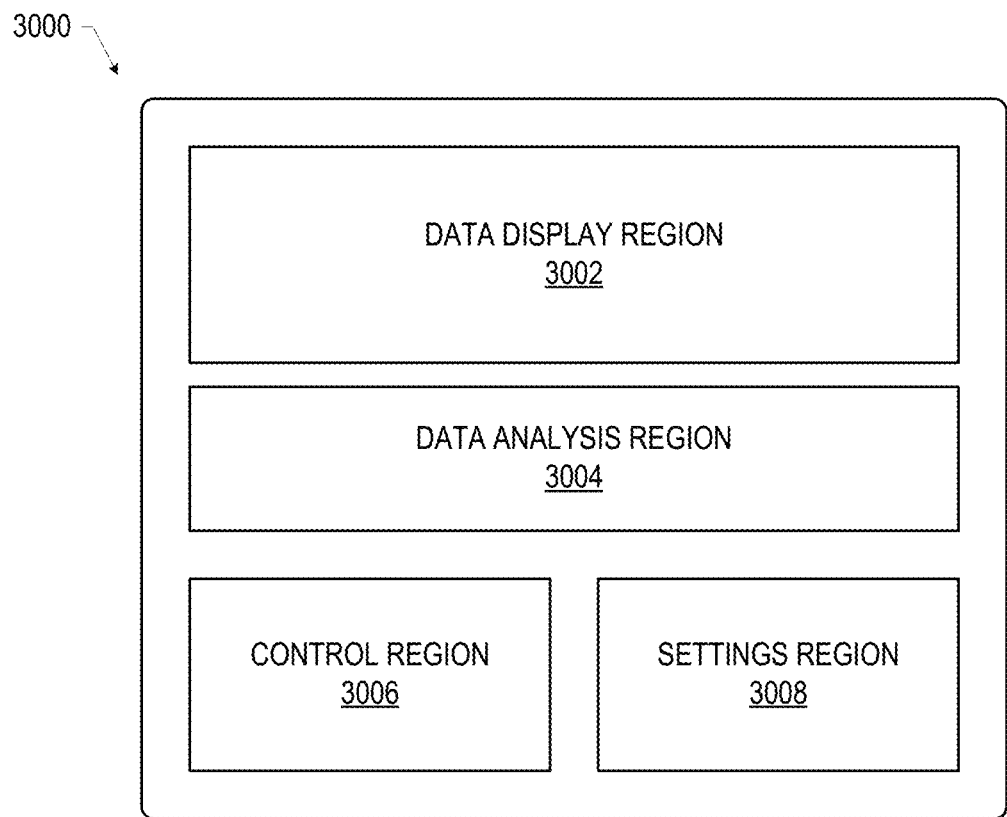
FIG. 5 is an example of a graphical user interface that may be used in the performance of some or all of the CPM reconstruction support methods disclosed herein, in accordance with various embodiments.

FIG. 5 depicts an example GUI 3000 that may be used in the performance of some or all of the reconstruction support methods disclosed herein, in accordance with various embodiments. As noted above, the GUI 3000 may be provided on a display device (e.g., the display device 4010 discussed herein with reference to FIG. 6) of a computing device (e.g., the computing device 4000 discussed herein with reference to FIG. 6) of a CPM support system (e.g., the CPM support system 5000 discussed herein with reference to FIG. 7), and a user may interact with the GUI 3000 using any suitable input device (e.g., any of the input devices included in the other I/O devices 4012 discussed herein with reference to FIG. 6) and input technique (e.g., movement of a cursor, motion capture, facial recognition, gesture detection, voice recognition, actuation of buttons, etc.). Any suitable ones of the logic discussed above with reference to the CPM reconstruction support module 1000 may provide instructions to cause the display of various kinds of information in the GUI 3000.

The GUI 3000 may include a data display region 3002, a data analysis region 3004, a CPM control region 3006, and a settings region 3008. The particular number and arrangement of regions depicted in FIG. 5 is simply illustrative, and any number and arrangement of regions, including any desired features, may be included in a GUI 3000.

The data display region 3002 may display data generated by a CPM (e.g., the CPM 5010 discussed herein with reference to FIG. 7). For example, the data display region 3002 may display the image received by the scan mask logic 1004 (e.g., the graphical representation 102 (FIG. 4A)), the data sets output by the processing logic 1006 (e.g., the graphical representation 108 (FIG. 4D)), or a three-dimensional reconstruction output by the reconstruction logic 1010 (which may be output in a video or other format conductive to communicating three-dimensional structure, not shown).

The data analysis region 3004 may display the results of data analysis (e.g., the results of analyzing the data illustrated in the data display region 3002 and/or other data). For example, the data analysis region 3004 may display a graphical representation of regions-of-interest identified by the scan mask logic 1004 (e.g., the graphical representation 104 (FIG. 4B)) or a graphical representation of a scan mask generated by the scan mask logic 1004 (e.g., the graphical representation 106 (FIG. 4C)). In some embodiments, the data display region 3002 and the data analysis region 3004 may be combined in the GUI 3000 (e.g., to include data output from a CPM, and some analysis of the data, in a common graph or region).

Figure 4F:
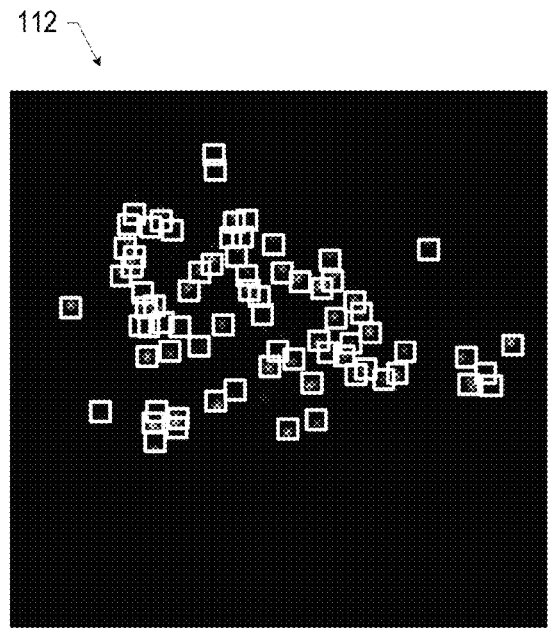
Figure 4G:
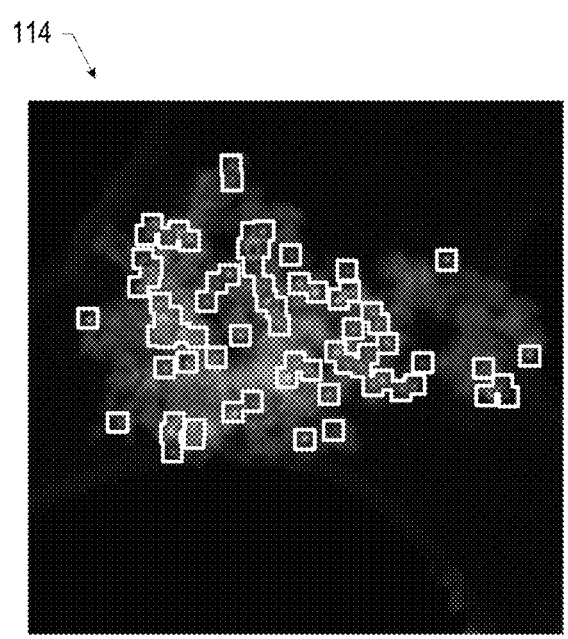

In some embodiments, the data display region 3002/data analysis region 3004 may display an image of the specimen at a particular angle (received by the scan mask logic 1004) concurrently with the display of a graphical representation of the associated scan mask (generated by the scan mask logic 1004). In some such embodiments, the graphical representation of the scan mask may be overlaid on the image of the specimen. For example, a display may take the form of the graphical representation 104 of FIG. 4B, for example (when the regions-of-interest correspond to the regions to be imaged in a scan mask) or may take the form of the graphical representation 114 of FIG. 4G (in which the boundaries of the scan mask area are indicated by the outline of the white areas of the graphical representation 106 of FIG. 4C).

In some embodiments, the data display region 3002/data analysis region 3004 may display analytical data (e.g., elementary characterization data) of the specimen at a particular angle (generated by the processing logic 1006)

concurrently with the display of a graphical representation of the associated scan mask (generated by the scan mask logic 1004). In some such embodiments, the graphical representation of the scan mask may be overlaid on the analytical data of the specimen. For example, a display may take the form of the graphical representation 112 of FIG. 4F, for example (in which the boundaries of the scan mask area are indicated by the outline of the white areas of the graphical representation 106 of FIG. 4C).

Figure 4H:
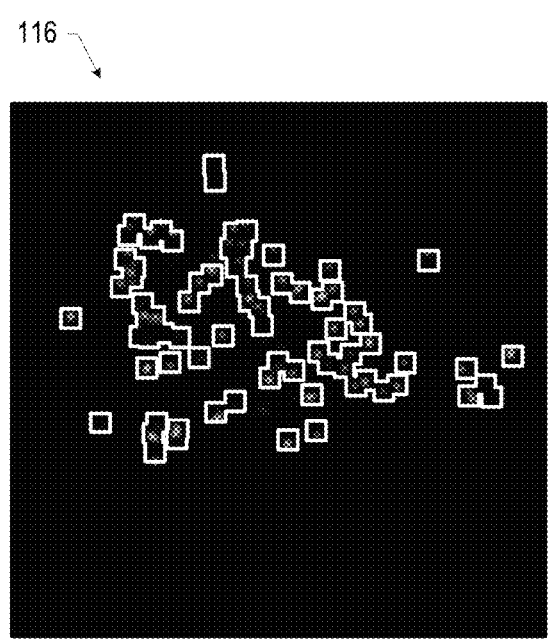

In some embodiments, the data display region 3002/data analysis region 3004 may display an image of the specimen at a particular angle (received by the scan mask logic 1004) concurrently with the display of analytical data (e.g., elemental characterization data) of the specimen at the particular angle (generated by the processing logic 1006). For example, the graphical representation 114 of FIG. 4G may be displayed concurrently with the graphical representation 116 of FIG. 4H (in which the boundaries of the scan mask area indicated by the outline of the white areas of the graphical representation 108 of FIG. 4D). The CPM control region 3006 may simultaneously be used to allow a user to indicate when adequate alignment between the image of the specimen at the angle and the display of analytical data of the specimen at the angle has been achieved (and thus three-dimensional reconstruction should be performed) or when inadequate alignment between the image of the specimen at the angle and the display of analytical data of the specimen at the angle has been achieved (and thus three-dimensional reconstruction should not be performed).

In some embodiments, the data display region 3002/data analysis region 3004 may display a graphical representation of a data set (associated with an angle) generated by the processing logic 1006 simultaneously with a graphical representation of an image (associated with the same angle) received by the scan mask logic 1004. For example, the graphical representation 102 of FIG. 4A may be displayed concurrently with the graphical representation 108 of FIG. 4D. In some embodiments, a graphical representation of a data set generated by the processing logic 1006 (e.g., a graphical representation of analytical data, such as elemental composition) may be overlaid on an image received by the scan mask logic 1004. For example, the graphical representation 108 of FIG. 4D may be overlaid (not shown) on the graphical representation 102 of FIG. 4A, with color used to distinguish the graphical representation 108 from the graphical representation 102. Such a display may show, using different colors, the locations of different elements (as determined by the processing logic 1006) in the image of the graphical representation 102 of FIG. 4A.

The CPM control region 3006 may include options that allow the user to control a CPM (e.g., the CPM 5010 discussed herein with reference to FIG. 7). For example, the CPM control region 3006 may include user interface features for adjusting a scan mask generated by the scan mask logic 1004, controlling the type of scan to be performed by the CPM, scheduling scans, and/or other control features.

The settings region 3008 may include options that allow the user to control the features and functions of the GUI 3000 (and/or other GUIs) and/or perform common computing operations with respect to the data display region 3002 and data analysis region 3004 (e.g., saving data on a storage device, such as the storage device 4004 discussed herein with reference to FIG. 6, sending data to another user, labeling data, any of the operations discussed herein with reference to the output logic 1008, etc.).

As noted above, the CPM reconstruction support module 1000 may be implemented by one or more computing devices. FIG. 6 is a block diagram of a computing device 4000 that may perform some or all of the CPM reconstruction support methods disclosed herein, in accordance with various embodiments. In some embodiments, the CPM reconstruction support module 1000 may be implemented by a single computing device 4000 or by multiple computing devices 4000. Further, as discussed below, a computing device 4000 (or multiple computing devices 4000) that implements the CPM reconstruction support module 1000 may be part of one or more of the CPM 5010, the user local computing device 5020, the service local computing device 5030, or the remote computing device 5040 of FIG. 7.

The computing device 4000 of FIG. 6 is illustrated as having a number of components, but any one or more of these components may be omitted or duplicated, as suitable for the application and setting. In some embodiments, some or all of the components included in the computing device 4000 may be attached to one or more motherboards and enclosed in a housing (e.g., including plastic, metal, and/or other materials). In some embodiments, some these components may be fabricated onto a single system-on-a-chip (SoC) (e.g., an SoC may include one or more processing devices 4002 and one or more storage devices 4004). Additionally, in various embodiments, the computing device 4000 may not include one or more of the components illustrated in FIG. 6, but may include interface circuitry (not shown) for coupling to the one or more components using any suitable interface (e.g., a Universal Serial Bus (USB) interface, a High-Definition Multimedia Interface (HDMI) interface, a Controller Area Network (CAN) interface, a Serial Peripheral Interface (SPI) interface, an Ethernet interface, a wireless interface, or any other appropriate interface). For example, the computing device 4000 may not include a display device 4010, but may include display device interface circuitry (e.g., a connector and driver circuitry) to which a display device 4010 may be coupled.

The computing device 4000 may include a processing device 4002 (e.g., one or more processing devices). As used herein, the term "processing device" may refer to any device or portion of a device that processes electronic data from registers and/or memory to transform that electronic data into other electronic data that may be stored in registers and/or memory. The processing device 4002 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

The computing device 4000 may include a storage device 4004 (e.g., one or more storage devices). The storage device 4004 may include one or more memory devices such as random access memory (RAM) (e.g., static RAM (SRAM) devices, magnetic RAM (MRAM) devices, dynamic RAM (DRAM) devices, resistive RAM (RRAM) devices, or conductive-bridging RAM (CBRAM) devices), hard drive-based memory devices, solid-state memory devices, networked drives, cloud drives, or any combination of memory devices. In some embodiments, the storage device 4004 may include memory that shares a die with a processing device 4002. In such an embodiment, the memory may be used as cache memory and may include embedded dynamic random-access memory (eDRAM) or spin transfer torque magnetic random-access memory (STT-MRAM), for example. In some embodiments, the storage device 4004 may include non-transitory computer readable media having instructions thereon that, when executed by one or more processing devices (e.g., the processing device 4002), cause the computing device 4000 to perform any appropriate ones of or portions of the methods disclosed herein.

The computing device 4000 may include an interface device 4006 (e.g., one or more interface devices 4006). The interface device 4006 may include one or more communication chips, connectors, and/or other hardware and software to govern communications between the computing device 4000 and other computing devices. For example, the interface device 4006 may include circuitry for managing wireless communications for the transfer of data to and from the computing device 4000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not. Circuitry included in the interface device 4006 for managing wireless communications may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). In some embodiments, circuitry included in the interface device 4006 for managing wireless communications may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. In some embodiments, circuitry included in the interface device 4006 for managing wireless communications may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). In some embodiments, circuitry included in the interface device 4006 for managing wireless communications may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. In some embodiments, the interface device 4006 may include one or more antennas (e.g., one or more antenna arrays) to receipt and/or transmission of wireless communications.

In some embodiments, the interface device 4006 may include circuitry for managing wired communications, such as electrical, optical, or any other suitable communication protocols. For example, the interface device 4006 may include circuitry to support communications in accordance with Ethernet technologies. In some embodiments, the interface device 4006 may support both wireless and wired communication, and/or may support multiple wired communication protocols and/or multiple wireless communication protocols. For example, a first set of circuitry of the interface device 4006 may be dedicated to shorter-range wireless communications such as Wi-Fi or Bluetooth, and a second set of circuitry of the interface device 4006 may be dedicated to longer-range wireless communications such as global positioning system (GPS), EDGE, GPRS, CDMA, WiMAX, LTE, EV-DO, or others. In some embodiments, a first set of circuitry of the interface device 4006 may be dedicated to wireless communications, and a second set of circuitry of the interface device 4006 may be dedicated to wired communications.

The computing device 4000 may include battery/power circuitry 4008. The battery/power circuitry 4008 may include one or more energy storage devices (e.g., batteries or capacitors) and/or circuitry for coupling components of the computing device 4000 to an energy source separate from the computing device 4000 (e.g., AC line power).

The computing device 4000 may include a display device 4010 (e.g., multiple display devices). The display device 4010 may include any visual indicators, such as a heads-up display, a computer monitor, a projector, a touchscreen display, a liquid crystal display (LCD), a light-emitting diode display, or a flat panel display.

The computing device 4000 may include other input/output (I/O) devices 4012. The other I/O devices 4012 may include one or more audio output devices (e.g., speakers, headsets, earbuds, alarms, etc.), one or more audio input devices (e.g., microphones or microphone arrays), location devices (e.g., GPS devices in communication with a satellite-based system to receive a location of the computing device 4000, as known in the art), audio codecs, video codecs, printers, sensors (e.g., thermocouples or other temperature sensors, humidity sensors, pressure sensors, vibration sensors, accelerometers, gyroscopes, etc.), image capture devices such as cameras, keyboards, cursor control devices such as a mouse, a stylus, a trackball, or a touchpad, bar code readers, Quick Response (QR) code readers, or radio frequency identification (RFID) readers, for example.

The computing device 4000 may have any suitable form factor for its application and setting, such as a handheld or mobile computing device (e.g., a cell phone, a smart phone, a mobile internet device, a tablet computer, a laptop computer, a netbook computer, an ultrabook computer, a personal digital assistant (PDA), an ultra-mobile personal computer, etc.), a desktop computing device, or a server computing device or other networked computing component.

One or more computing devices implementing any of the CPM reconstruction support modules or methods disclosed herein may be part of a CPM support system. FIG. 7 is a block diagram of an example CPM support system 5000 in which some or all of the CPM reconstruction support methods disclosed herein may be performed, in accordance with various embodiments. The CPM reconstruction support modules and methods disclosed herein (e.g., the CPM reconstruction support module 1000 of FIG. 2 and the method 2000 of FIG. 3) may be implemented by one or more of the CPM 5010, the user local computing device 5020, the service local computing device 5030, or the remote computing device 5040 of the CPM support system 5000.

Any of the CPM 5010, the user local computing device 5020, the service local computing device 5030, or the remote computing device 5040 may include any of the embodiments of the computing device 4000 discussed herein with reference to FIG. 6, and any of the CPM 5010, the user local computing device 5020, the service local computing device 5030, or the remote computing device 5040 may take the form of any appropriate ones of the embodiments of the computing device 4000 discussed herein with reference to FIG. 6.

The CPM 5010, the user local computing device 5020, the service local computing device 5030, or the remote computing device 5040 may each include a processing device 5002, a storage device 5004, and an interface device 5006. The processing device 5002 may take any suitable form, including the form of any of the processing devices 4002 discussed herein with reference to FIG. 4, and the processing devices 5002 included in different ones of the CPM 5010, the user local computing device 5020, the service local computing device 5030, or the remote computing device 5040 may take the same form or different forms. The storage device 5004 may take any suitable form, including the form of any of the storage devices 5004 discussed herein with reference to FIG. 4, and the storage devices 5004 included in different ones of the CPM 5010, the user local computing device 5020, the service local computing device 5030, or the remote computing device 5040 may take the same form or different forms. The interface device 5006 may take any suitable form, including the form of any of the interface devices 4006 discussed herein with reference to FIG. 4, and the interface devices 5006 included in different ones of the CPM 5010, the user local computing device 5020, the service local computing device 5030, or the remote computing device 5040 may take the same form or different forms.

The CPM 5010 may include any of the CPMs discussed herein (e.g., the CPM 1 of FIG. 1). The CPM 5010, the user local computing device 5020, the service local computing device 5030, and the remote computing device 5040 may be in communication with other elements of the CPM support system 5000 via communication pathways 5008. The communication pathways 5008 may communicatively couple the interface devices 5006 of different ones of the elements of the CPM support system 5000, as shown, and may be wired or wireless communication pathways (e.g., in accordance with any of the communication techniques discussed herein with reference to the interface devices 4006 of the computing device 4000 of FIG. 6). The particular CPM support system 5000 depicted in FIG. 7 includes communication pathways between each pair of the CPM 5010, the user local computing device 5020, the service local computing device 5030, and the remote computing device 5040, but this "fully connected" implementation is simply illustrative, and in various embodiments, various ones of the communication pathways 5008 may be absent. For example, in some embodiments, a service local computing device 5030 may not have a direct communication pathway 5008 between its interface device 5006 and the interface device 5006 of the CPM 5010, but may instead communicate with the CPM 5010 via the communication pathway 5008 between the service local computing device 5030 and the user local computing device 5020 and the communication pathway 5008 between the user local computing device 5020 and the CPM 5010.

The user local computing device 5020 may be a computing device (e.g., in accordance with any of the embodiments of the computing device 4000 discussed herein) that is local to a user of the CPM 5010. In some embodiments, the user local computing device 5020 may also be local to the CPM 5010, but this need not be the case; for example, a user local computing device 5020 that is in a user's home or office may be remote from, but in communication with, the CPM 5010 so that the user may use the user local computing device 5020 to control and/or access data from the CPM 5010. In some embodiments, the user local computing device 5020 may be a laptop, smartphone, or tablet device. In some embodiments the user local computing device 5020 may be a portable computing device.

The service local computing device 5030 may be a computing device (e.g., in accordance with any of the embodiments of the computing device 4000 discussed herein) that is local to an entity that services the CPM 5010. For example, the service local computing device 5030 may be local to a manufacturer of the CPM 5010 or to a third-party service company. In some embodiments, the service local computing device 5030 may communicate with the CPM 5010, the user local computing device 5020, and/or the remote computing device 5040 (e.g., via a direct communication pathway 5008 or via multiple "indirect" communication pathways 5008, as discussed above) to receive data regarding the operation of the CPM 5010, the user local computing device 5020, and/or the remote computing device 5040 (e.g., the results of self-tests of the CPM 5010, calibration coefficients used by the CPM 5010, the measurements of sensors associated with the CPM 5010, etc.). In some embodiments, the service local computing device 5030 may communicate with the CPM 5010, the user local computing device 5020, and/or the remote computing device 5040 (e.g., via a direct communication pathway 5008 or via multiple "indirect" communication pathways 5008, as discussed above) to transmit data to the CPM 5010, the user local computing device 5020, and/or the remote computing device 5040 (e.g., to update programmed instructions, such as firmware, in the CPM 5010, to initiate the performance of test or calibration sequences in the CPM 5010, to update programmed instructions, such as software, in the user local computing device 5020 or the remote computing device 5040, etc.). A user of the CPM 5010 may utilize the CPM 5010 or the user local computing device 5020 to communicate with the service local computing device 5030 to report a problem with the CPM 5010 or the user local computing device 5020, to request a visit from a technician to improve the operation of the CPM 5010, to order consumables or replacement parts associated with the CPM 5010, or for other purposes. T The remote computing device 5040 may be a computing device (e.g., in accordance with any of the embodiments of the computing device 4000 discussed herein) that is remote from the CPM 5010 and/or from the user local computing device 5020. In some embodiments, the remote computing device 5040 may be included in a datacenter or other large-scale server environment. In some embodiments, the remote computing device 5040 may include network-attached storage (e.g., as part of the storage device 5004). The remote computing device 5040 may store data generated by the CPM 5010, perform analyses of the data generated by the CPM 5010 (e.g., in accordance with programmed instructions), facilitate communication between the user local computing device 5020 and the CPM 5010, and/or facilitate communication between the service local computing device 5030 and the CPM 5010.

In some embodiments, one or more of the elements of the CPM support system 5000 illustrated in FIG. 7 may not be present. Further, in some embodiments, multiple ones of various ones of the elements of the CPM support system 5000 of FIG. 7 may be present. For example, a CPM support system 5000 may include multiple user local computing devices 5020 (e.g., different user local computing devices 5020 associated with different users or in different locations). In another example, a CPM support system 5000 may include multiple CPMs 5010, all in communication with service local computing device 5030 and/or a remote computing device 5040; in such an embodiment, the service local computing device 5030 may monitor these multiple CPMs 5010, and the service local computing device 5030 may cause updates or other information may be "broadcast" to multiple CPMs 5010 at the same time. Different ones of the CPMs 5010 in a CPM support system 5000 may be located close to one another (e.g., in the same room) or farther from one another (e.g., on different floors of a building, in different buildings, in different cities, etc.). In some embodiments, a CPM 5010 may be connected to an Internet-of-Things (IoT) stack that allows for command and control of the CPM 5010 through a web-based application, a virtual or augmented reality application, a mobile application, and/or a desktop application. Any of these applications may be accessed by a user operating the user local computing device 5020 in communication with the CPM 5010 by the intervening remote computing device 5040. In some embodiments, a CPM 5010 may be sold by the manufacturer along with one or more associated user local computing devices 5020 as part of a local CPM computing unit 5012.

The following paragraphs provide various examples of the embodiments disclosed herein.

Example 1 is a charged particle microscope computational support apparatus, including: first logic to, for each angle of a plurality of angles: receive an associated image of a specimen at the angle, and generate an associated scan mask based on one or more regions-of-interest in the associated image; second logic to, for each angle of the plurality of angles, generate an associated data set of the specimen by processing data from a scan, in accordance with the associated scan mask, by a charged particle microscope of the specimen at the angle; and third logic to provide, for each angle of the plurality of angles, the associated data set of the specimen to reconstruction logic to generate a three-dimensional reconstruction of the specimen.

Example 2 includes the subject matter of Example 1, and further specifies that the plurality of angles is a plurality of tilt angles.

Example 3 includes the subject matter of any of Examples 1-2, and further includes: the reconstruction logic.

Example 4 includes the subject matter of any of Examples 1-3, and further specifies that, for at least one angle of the plurality of angles, the associated data set of the specimen includes at least one zero data region.

Example 5 includes the subject matter of any of Examples 1-4, and further specifies that, for at least one angle of the plurality of angles, the associated data set of the specimen includes at least one non-zero data region.

Example 6 includes the subject matter of any of Examples 1-5, and further specifies that the at least one non-zero data region has a rounded rectangular boundary.

Example 7 includes the subject matter of any of Examples 1-6, and further specifies that the at least one non-zero data region has a rectangular boundary.

Example 8 includes the subject matter of any of Examples 1-7, and further specifies that the at least one non-zero data region has a square boundary.

Example 9 includes the subject matter of any of Examples 1-8, and further specifies that, for at least one angle of the plurality of angles, the associated data set of the specimen includes a first non-zero data region corresponding to a first portion of the specimen, a second non-zero data region corresponding to a second portion of the specimen, and a zero data region between the first non-zero data region and the second non-zero data region.

Example 10 includes the subject matter of any of Examples 1-9, and further specifies that the reconstruction logic is to perform, using the data sets of the specimen, a tomographic reconstruction, a weighted back projection (WBP), a simultaneous iterative reconstruction technique (SIRT), a high-angle annular dark-field imaging (HAADF)- energy dispersive spectroscopy (EDS) bimodal tomography (HEBT) technique, a conjugate gradient least squares (CGLS) technique, an expectation maximization (EM) technique, a simultaneous algebraic reconstruction technique (SART), or a diffraction tomography technique.

Example 11 includes the subject matter of any of Examples 1-10, and further specifies that the data sets of the specimen include energy dispersive spectroscopy (EDS) data.

Example 12 includes the subject matter of any of Examples 1-11, and further specifies that the data sets of the specimen include electron energy loss spectroscopy (EELS) data.

Example 13 includes the subject matter of any of Examples 1-12, and further specifies that the data sets of the specimen include diffraction pattern data.

Example 14 includes the subject matter of Example 13, and further specifies that the three-dimensional reconstruction of the specimen includes a crystal structure of the specimen.

Example 15 includes the subject matter of any of Examples 1-14, and further specifies that the data sets of the specimen include high-resolution images.

Example 16 includes the subject matter of any of Examples 1-15, and further specifies that the data sets of the specimen include spectral information.

Example 17 includes the subject matter of any of Examples 1-16, and further includes: fourth logic to, for each angle of the plurality of angles, cause the charged particle microscope to generate the associated image of the specimen at the angle.

Example 18 includes the subject matter of Example 17, and further specifies that, for an individual angle of the plurality of angles, an acquisition time for the generation of the associated image of the specimen at the individual angle is less than an acquisition time for the generation of the associated data set of the specimen at the individual angle in accordance with the associated scan mask.

Example 19 includes the subject matter of any of Examples 17-18, and further specifies that: for an individual angle of the plurality of angles, a radiation dose for the generation of the associated data set of the specimen at the individual angle in accordance with the associated scan mask is less than a radiation dose for the generation of a full frame data set of the specimen at the individual angle; or for an individual angle of the plurality of angles, a resolution of the associated data set of the specimen at the individual angle in accordance with the associated scan mask is less than a resolution of a full frame data set of the specimen at the individual angle.

Example 20 includes the subject matter of any of Examples 17-19, and further specifies that the images of the specimen include bright-field images, annular bright-field (ABF) images, integrated differential phase contrast (iDPC) images, or high-angle annular dark-field (HAADF) images.

Example 21 includes the subject matter of any of Examples 1-20, and further specifies that, for each angle of the plurality of angles, the associated scan mask indicates to scan the one or more regions-of-interest and to not scan at least one other region.

Example 22 includes the subject matter of Example 21, and further specifies that the first logic is to, for each angle of the plurality of angles, identify the one or more regions-of-interest in the associated image, and identifying the one or more regions-of-interest in the associated image includes identifying at least one particle in the associated image.

Example 23 includes the subject matter of any of Examples 21-22, and further specifies that the first logic is to, for each angle of the plurality of angles, identify the one or more regions-of-interest in the associated image, and identifying the one or more regions-of-interest in the associated image includes applying, to the associated image, of a centroid-finding technique, a thresholding technique, an attention-based transformer network technique, or a neural network technique.

Example 24 includes the subject matter of any of Examples 1-23, and further specifies that the associated images of the specimen are low-resolution images.

Example 25 includes the subject matter of Example 24, and further specifies that the associated data sets of the specimen are high-resolution images.

Example 26 includes the subject matter of any of Examples 1-25, and further specifies that the first logic is to, for an individual angle of the plurality of angles, cause a display device to display a graphical representation of the associated scan mask.

Example 27 includes the subject matter of Example 26, and further specifies that the first logic is to, for the individual angle of the plurality of angles, provide instructions to cause a display device to display an image of the specimen at the individual angle concurrently with the display of the graphical representation of the associated scan mask.

Example 28 includes the subject matter of Example 27, and further specifies that the first logic is to, for the individual angle of the plurality of angles, cause a display device to display an image of the specimen at the individual angle overlaid with the graphical representation of the associated scan mask.

Example 29 includes the subject matter of any of Examples 26-28, and further specifies that the graphical representation of the associated scan mask includes one or more shapes indicating boundaries of regions to be scanned.

Example 30 includes the subject matter of any of Examples 26-29, and further specifies that the first logic is to, for the individual angle of the plurality of angles, cause a display device to display analytical data of the specimen at the individual angle concurrently with the display of the graphical representation of the associated scan mask.

Example 31 includes the subject matter of Example 30, and further specifies that the first logic is to, for the individual angle of the plurality of angles, cause a display device to display (1) an image of the specimen at the individual angle overlaid with a first graphical representation of the associated scan mask, and (2) analytical data of the specimen at the individual angle overlaid with a second graphical representation of the associated scan mask.

Example 32 includes the subject matter of any of Examples 1-31, and further specifies that, for each angle of the plurality of angles, the associated data set includes an identification of one or more chemical elements present in the specimen at the associated angle.

Example 33 includes the subject matter of Example 32, and further specifies that the second logic is to, for an individual angle of the plurality of angles, cause a display device to display a graphical representation of the identification of one or more chemical elements in the specimen at the individual angle.

Example 34 includes the subject matter of Example 33, and further specifies that the second logic is to, for the individual angle of the plurality of angles, cause a display device to display a graphical representation of the identification of one or more chemical elements in the specimen at the individual angle overlaid on an image of the specimen at the individual angle.

Example 35 includes the subject matter of Example 34, and further specifies that the image of the specimen is a low-resolution image.

Example 36 includes the subject matter of any of Examples 34-35, and further specifies that the image of the specimen is a bright-field image, an annular bright-field (ABF) image, an integrated differential phase contrast (iDPC) image, or a high-angle annular dark-field (HAADF) image.

Example 37 includes the subject matter of any of Examples 1-36, and further specifies that, for each angle of the plurality of angles, the associated data set includes a two-dimensional array associated with each location of the specimen at the angle.

Example 38 includes the subject matter of any of Examples 1-37, and further specifies that the charged particle microscope includes a scanning electron microscope (SEM), a transmission electron microscope (TEM), a scanning transmission electron microscope (STEM), or a cryo-electron microscope (cryoEM).

Example 39 includes the subject matter of any of Examples 1-38, and further specifies that the second logic is to, for each angle of the plurality of angles, generate an associated data set of the specimen by processing electron diffraction data of the specimen at the angle generated by the charged particle microscope in accordance with the associated scan mask.

Example 40 includes the subject matter of Example 39, and further specifies that the electron diffraction data includes position-averaged convergent beam electron diffraction (PACBED) data.

Example 41 includes the subject matter of any of Examples 1-40, and further specifies that, for each angle of the plurality of angles, the associated data set includes cathodoluminescence (CL) data, Raman imaging data, Auger electron spectroscopy (ASE) data, back-scattered electron (BSE) data, or secondary electron (SE) data.

Example 42 includes the subject matter of any of Examples 1-41, and further includes: the charged particle microscope.

Example 43 includes the subject matter of any of Examples 1-42, and further specifies that processing data from a scan, in accordance with the associated scan mask, by a charged particle microscope of the specimen at the angle includes storing data from a scan, in accordance with the associated scan mask, by a charged particle microscope of the specimen at the angle.

Example 44 includes the subject matter of any of Examples 1-43, and further specifies that processing data from a scan, in accordance with the associated scan mask, by a charged particle microscope of the specimen at the angle includes filtering data from a scan, in accordance with the associated scan mask, by a charged particle microscope of the specimen at the angle.

Example 45 includes the subject matter of any of Examples 1-44, and further specifies that processing data from a scan, in accordance with the associated scan mask, by a charged particle microscope of the specimen at the angle includes aligning data associated with a first angle to data associated with a second angle.

Example 46 includes the subject matter of any of Examples 1-45, and further specifies that processing data from a scan, in accordance with the associated scan mask, by a charged particle microscope of the specimen at the angle includes performing elemental analysis on the data from the scan.

Example 47 is a charged particle microscope computational support apparatus, including: first logic to, for each angle of a plurality of angles, generate an associated scan mask for scanning a specimen, wherein a scan mask associated with a first angle of the plurality of angles is different than a scan mask associated with a second angle of the plurality of angles that is different from the first angle; and second logic to, for each angle of the plurality of angles, generate an associated data set of the specimen based on a scan by a charged particle microscope of the specimen at the angle in accordance with the associated scan mask.

Example 48 includes the subject matter of Example 47, and further includes:

third logic to provide, for each angle of the plurality of angles, the associated data set of the specimen to reconstruction logic to generate a three-dimensional reconstruction of the specimen.

Example 49 includes the subject matter of Example 48, and further includes: the reconstruction logic.

Example 50 includes the subject matter of any of Examples 48-49, and further specifies that, for at least one angle of the plurality of angles, the associated data set of the specimen includes at least one zero data region.

Example 51 includes the subject matter of any of Examples 48-50, and further specifies that, for at least one angle of the plurality of angles, the associated data set of the specimen includes at least one non-zero data region.

Example 52 includes the subject matter of any of Examples 48-51, and further specifies that the at least one non-zero data region has a rounded rectangular boundary.

Example 53 includes the subject matter of any of Examples 48-52, and further specifies that the at least one non-zero data region has a rectangular boundary.

Example 54 includes the subject matter of any of Examples 48-53, and further specifies that the at least one non-zero data region has a square boundary.

Example 55 includes the subject matter of any of Examples 48-54, and further specifies that, for at least one angle of the plurality of angles, the associated data set of the specimen includes a first non-zero data region corresponding to a first portion of the specimen, a second non-zero data region corresponding to a second portion of the specimen, and a zero data region between the first non-zero data region and the second non-zero data region.

Example 56 includes the subject matter of any of Examples 48-55, and further specifies that the data sets of the specimen include electron diffraction data and the three-dimensional reconstruction of the specimen includes a crystal structure of the specimen.

Example 57 includes the subject matter of any of Examples 48-56, and further specifies that the reconstruction logic is to perform, using the data sets of the specimen, a tomographic reconstruction, a weighted back projection (WBP), a simultaneous iterative reconstruction technique (SIRT), a high-angle annular dark-field imaging (HAADF)-energy dispersive spectroscopy (EDS) bimodal tomography (HEBT) technique, a conjugate gradient least squares (CGLS) technique, an expectation maximization (EM) technique, a simultaneous algebraic reconstruction technique (SART), or a diffraction tomography technique.

Example 58 includes the subject matter of any of Examples 47-57, and further specifies that the data sets of the specimen include energy dispersive spectroscopy (EDS) data.

Example 59 includes the subject matter of any of Examples 47-58, and further specifies that the data sets of the specimen include electron energy loss spectroscopy (EELS) data.

Example 60 includes the subject matter of any of Examples 47-59, and further specifies that the data sets of the specimen include diffraction pattern data.

Example 61 includes the subject matter of any of Examples 47-60, and further specifies that the data sets of the specimen include high-resolution images.

Example 62 includes the subject matter of any of Examples 47-61, and further specifies that the data sets of the specimen include spectral information.

Example 63 includes the subject matter of any of Examples 47-62, and further specifies that the first logic is to, for each angle of the plurality of angles: receive an associated image of the specimen at the angle; and generate the associated scan mask based on the associated image.

Example 64 includes the subject matter of Example 63, and further includes: fourth logic to, for each angle of the plurality of angles, cause the charged particle microscope to generate the associated image of the specimen at the angle.

Example 65 includes the subject matter of Example 64, and further specifies that: for an individual angle of the plurality of angles, an acquisition time for the generation of the associated image of the specimen at the individual angle is less than an acquisition time for the generation of the associated data set of the specimen at the individual angle in accordance with the associated scan mask; or for an individual angle of the plurality of angles, a resolution of the associated data set of the specimen at the individual angle in accordance with the associated scan mask is less than a resolution of a full frame data set of the specimen at the individual angle.

Example 66 includes the subject matter of any of Examples 64-65, and further specifies that, for an individual angle of the plurality of angles, a radiation dose for the generation of the associated data set of the specimen at the individual angle in accordance with the associated scan mask is less than a radiation dose for the generation of a full frame data set of the specimen at the individual angle.

Example 67 includes the subject matter of any of Examples 64-66, and further specifies that the images of the specimen include bright-field images, annular bright-field (ABF) images, integrated differential phase contrast (iDPC) images, or high-angle annular dark-field (HAADF) images.

Example 68 includes the subject matter of any of Examples 63-67, and further specifies that: the first logic is to, for each angle of the plurality of angles, identify at least one region-of-interest and at least one other region in the associated image; and the associated scan mask indicates to scan the identified at least one region-of-interest and to not scan the at least one other region.

Example 69 includes the subject matter of Example 68, and further specifies that the identification of at least one region-of-interest in the associated image includes the identification of at least one particle in the associated image.

Example 70 includes the subject matter of any of Examples 68-69, and further specifies that the identification of at least one region-of-interest in the associated image includes application, to the associated image, of a centroid-finding technique, a thresholding technique, an attention-based transformer network technique, or a neural network technique.

Example 71 includes the subject matter of any of Examples 63-70, and further specifies that the associated images of the specimen are low-resolution images.

Example 72 includes the subject matter of Example 71, and further specifies that the associated data sets of the specimen are high-resolution images.

Example 73 includes the subject matter of any of Examples 47-72, and further specifies that the first logic is to, for an individual angle of the plurality of angles, cause a display device to display a graphical representation of the associated scan mask.

Example 74 includes the subject matter of Example 73, and further specifies that the first logic is to, for the individual angle of the plurality of angles, cause a display device to display an image of the specimen at the individual angle concurrently with the display of the graphical representation of the associated scan mask.

Example 75 includes the subject matter of Example 74, and further specifies that the first logic is to, for the individual angle of the plurality of angles, cause a display device to display an image of the specimen at the individual angle overlaid with the graphical representation of the associated scan mask.

Example 76 includes the subject matter of any of Examples 73-75, and further specifies that the graphical representation of the associated scan mask includes one or more shapes indicating boundaries of regions to be scanned.

Example 77 includes the subject matter of any of Examples 73-76, and further specifies that the first logic is to, for the individual angle of the plurality of angles, cause a display device to display analytical data of the specimen at the individual angle concurrently with the display of the graphical representation of the associated scan mask.

Example 78 includes the subject matter of any of Examples 77, and further specifies that the first logic is to, for the individual angle of the plurality of angles, cause a display device to display (1) an image of the specimen at the individual angle overlaid with a first graphical representation of the associated scan mask, and (2) analytical data of the specimen at the individual angle overlaid with a second graphical representation of the associated scan mask.

Example 79 includes the subject matter of any of Examples 47-78, and further specifies that, for each angle of the plurality of angles, the associated data set includes an identification of one or more chemical elements present in the specimen at the associated angle.

Example 80 includes the subject matter of Example 79, and further specifies that the second logic is to, for an individual angle of the plurality of angles, cause a display device to display a graphical representation of the identification of one or more chemical elements at the associated angle.

Example 81 includes the subject matter of Example 80, and further specifies that the second logic is to, for the individual angle of the plurality of angles, cause a display device to display a graphical representation of the identification of one or more chemical elements at the associated angle overlaid on an image of the specimen at the associated angle.

Example 82 includes the subject matter of Example 81, and further specifies that the image of the specimen is a low-resolution image.

Example 83 includes the subject matter of any of Examples 81-82, and further specifies that the image of the specimen is a bright-field image, an annular bright-field (ABF) image, an integrated differential phase contrast (iDPC) image, or a high-angle annular dark-field (HAADF) image.

Example 84 includes the subject matter of any of Examples 47-83, and further specifies that, for each angle of the plurality of angles, the associated data set includes a two-dimensional array associated with each location of the specimen at the angle.

Example 85 includes the subject matter of any of Examples 47-84, and further specifies that the charged particle microscope includes a scanning electron microscope (SEM), a transmission electron microscope (TEM), a scanning transmission electron microscope (STEM), or a cryo-electron microscope (cryoEM).

Example 86 includes the subject matter of any of Examples 47-85, and further specifies that the second logic is to, for each angle of the plurality of angles, generate an associated data set of the specimen based on electron diffraction data of the specimen at the angle generated by the charged particle microscope in accordance with the associated scan mask.

Example 87 includes the subject matter of Example 86, and further specifies that the electron diffraction data includes position-averaged convergent beam electron diffraction (PACBED) data.

Example 88 includes the subject matter of any of Examples 47-87, and further specifies that, for each angle of the plurality of angles, the associated data set includes cathodoluminescence (CL) data, Raman imaging data, Auger electron spectroscopy (ASE) data, back-scattered electron (BSE) data, or secondary electron (SE) data.

Example 89 includes the subject matter of any of Examples 47-88, and further includes: the charged particle microscope.

Example 90 includes the subject matter of any of Examples 47-89, and further specifies that processing a scan by a charged particle microscope of the specimen at the angle in accordance with the associated scan mask includes storing scan data generated by a charged particle microscope of the specimen at the angle in accordance with the associated scan mask.

Example 91 includes the subject matter of any of Examples 47-90, and further specifies that processing a scan by a charged particle microscope of the specimen at the angle in accordance with the associated scan mask includes filtering scan data generated by a charged particle microscope of the specimen at the angle in accordance with the associated scan mask.

Example 92 includes the subject matter of any of Examples 47-91, and further specifies that processing a scan by a charged particle microscope of the specimen at the angle in accordance with the associated scan mask includes aligning scan data associated with the first angle to scan data associated with the second angle.

Example 93 includes the subject matter of any of Examples 47-92, and further specifies that processing a scan by a charged particle microscope of the specimen at the angle in accordance with the associated scan mask includes performing elemental analysis on scan data.

Example 94 includes the subject matter of any of Examples 47-93, and further specifies that the plurality of angles is a plurality of tilt angles.

Example 95 is a charged particle microscope computational support apparatus, including: first logic to, for each angle of a plurality of angles, generate an associated scan mask for scanning a specimen; second logic to, for each angle of the plurality of angles, cause a charged particle microscope to scan the specimen at the angle in accordance with the associated scan mask, and to generate an associated data set of the specimen based on the scan of the specimen at the angle; and third logic to provide, for each angle of the plurality of angles, the associated data set of the specimen to reconstruction logic to generate a three-dimensional reconstruction of the specimen.

Example 96 includes the subject matter of Example 95, and further specifies that the plurality of angles is a plurality of tilt angles.

Example 97 includes the subject matter of any of Examples 95-96, and further includes: the reconstruction logic.

Example 98 includes the subject matter of any of Examples 95-97, and further specifies that, for at least one angle of the plurality of angles, the associated data set of the specimen includes at least one zero data region.

Example 99 includes the subject matter of any of Examples 95-98, and further specifies that, for at least one angle of the plurality of angles, the associated data set of the specimen includes at least one non-zero data region.

Example 100 includes the subject matter of any of Examples 95-99, and further specifies that the at least one non-zero data region has a rounded rectangular boundary.

Example 101 includes the subject matter of any of Examples 95-100, and further specifies that the at least one non-zero data region has a rectangular boundary.

Example 102 includes the subject matter of any of Examples 95-101, and further specifies that the at least one non-zero data region has a square boundary.

Example 103 includes the subject matter of any of Examples 95-102, and further specifies that, for at least one angle of the plurality of angles, the associated data set of the specimen includes a first non-zero data region corresponding to a first portion of the specimen, a second non-zero data region corresponding to a second portion of the specimen, and a zero data region between the first non-zero data region and the second non-zero data region.

Example 104 includes the subject matter of any of Examples 95-103, and further specifies that the reconstruction logic is to perform, using the data sets of the specimen, a tomographic reconstruction, a weighted back projection (WBP), a simultaneous iterative reconstruction technique (SIRT), a high-angle annular dark-field imaging (HAADF)-energy dispersive spectroscopy (EDS) bimodal tomography (HEBT) technique, a conjugate gradient least squares (CGLS) technique, an expectation maximization (EM) technique, a simultaneous algebraic reconstruction technique (SART), or a diffraction tomography technique.

Example 105 includes the subject matter of any of Examples 95-104, and further specifies that the data sets of the specimen include energy dispersive spectroscopy (EDS) data.

Example 106 includes the subject matter of any of Examples 95-105, and further specifies that the data sets of the specimen include electron energy loss spectroscopy (EELS) data.

Example 107 includes the subject matter of any of Examples 95-106, and further specifies that the data sets of the specimen include diffraction pattern data.

Example 108 includes the subject matter of Example 107, and further specifies that the three-dimensional reconstruction of the specimen includes a crystal structure of the specimen.

Example 109 includes the subject matter of any of Examples 95-108, and further specifies that the data sets of the specimen include high-resolution images.

Example 110 includes the subject matter of any of Examples 95-109, and further specifies that the data sets of the specimen include spectral information.

Example 111 includes the subject matter of any of Examples 95-110, and further specifies that the first logic is to, for each angle of the plurality of angles: receive an associated image of the specimen at the angle; and generate the associated scan mask based on the associated image.

Example 112 includes the subject matter of Example 111, and further includes: fourth logic to, for each angle of the plurality of angles, cause the charged particle microscope to generate the associated image of the specimen at the angle.

Example 113 includes the subject matter of Example 112, and further specifies that: for an individual angle of the plurality of angles, an acquisition time for the generation of the associated image of the specimen at the individual angle is less than an acquisition time for the generation of the associated data set of the specimen at the individual angle in accordance with the associated scan mask; or for an individual angle of the plurality of angles, a resolution of the associated data set of the specimen at the individual angle in accordance with the associated scan mask is less than a resolution of a full frame data set of the specimen at the individual angle.

Example 114 includes the subject matter of any of Examples 112-113, and further specifies that, for an individual angle of the plurality of angles, a radiation dose for the generation of the associated data set of the specimen at the individual angle in accordance with the associated scan mask is less than a radiation dose for the generation of a full frame data set of the specimen at the individual angle.

Example 115 includes the subject matter of any of Examples 112-114, and further specifies that the images of the specimen include bright-field images, annular bright-field (ABF) images, integrated differential phase contrast (iDPC) images, or high-angle annular dark-field (HAADF) images.

Example 116 includes the subject matter of any of Examples 111-115, and further specifies that: the first logic is to, for each angle of the plurality of angles, identify at least one region-of-interest and at least one other region in the associated image; and the associated scan mask indicates to scan the identified at least one region-of-interest and to not scan the at least one other region.

Example 117 includes the subject matter of Example 116, and further specifies that the identification of at least one region-of-interest in the associated image includes the identification of at least one particle in the associated image.

Example 118 includes the subject matter of any of Examples 116-117, and further specifies that the identification of at least one region-of-interest in the associated image includes application, to the associated image, of a centroid-finding technique, a thresholding technique, an attention-based transformer network technique, or a neural network technique.

Example 119 includes the subject matter of any of Examples 111-118, and further specifies that the associated images of the specimen are low-resolution images.

Example 120 includes the subject matter of Example 119, and further specifies that the associated data sets of the specimen are high-resolution images.

Example 121 includes the subject matter of any of Examples 95-120, and further specifies that the first logic is to, for an individual angle of the plurality of angles, cause a display device to display a graphical representation of the associated scan mask.

Example 122 includes the subject matter of Example 121, and further specifies that the first logic is to, for the individual angle of the plurality of angles, cause a display device to display an image of the specimen at the individual angle concurrently with the display of the graphical representation of the associated scan mask.

Example 123 includes the subject matter of Example 122, and further specifies that the first logic is to, for the individual angle of the plurality of angles, cause a display device to display an image of the specimen at the individual angle overlaid with the graphical representation of the associated scan mask.

Example 124 includes the subject matter of any of Examples 121-123, and further specifies that the graphical representation of the associated scan mask includes one or more shapes indicating boundaries of regions to be scanned.

Example 125 includes the subject matter of any of Examples 121-124, and further specifies that the first logic is to, for the individual angle of the plurality of angles, cause a display device to display analytical data of the specimen at the individual angle concurrently with the display of the graphical representation of the associated scan mask.

Example 126 includes the subject matter of Example 125, and further specifies that the first logic is to, for the individual angle of the plurality of angles, cause a display device to display (1) an image of the specimen at the individual angle overlaid with a first graphical representation of the associated scan mask, and (2) analytical data of the specimen at the individual angle overlaid with a second graphical representation of the associated scan mask.

Example 127 includes the subject matter of any of Examples 95-126, and further specifies that, for each angle of the plurality of angles, the associated data set includes an identification of one or more chemical elements present in the specimen at the associated angle.

Example 128 includes the subject matter of Example 127, and further specifies that the second logic is to, for an individual angle of the plurality of angles, cause a display device to display a graphical representation of the identification of one or more chemical elements at the associated angle.

Example 129 includes the subject matter of Example 128, and further specifies that the second logic is to, for the individual angle of the plurality of angles, cause a display device to display a graphical representation of the identification of one or more chemical elements present in the specimen at the associated angle overlaid on an image of the specimen at the associated angle.

Example 130 includes the subject matter of Example 129, and further specifies that the image of the specimen is a low-resolution image.

Example 131 includes the subject matter of any of Examples 129-130, and further specifies that the image of the specimen is a bright-field image, an annular bright-field (ABF) image, an integrated differential phase contrast (iDPC) image, or a high-angle annular dark-field (HAADF) image.

Example 132 includes the subject matter of any of Examples 95-131, and further specifies that, for each angle of the plurality of angles, the associated data set includes a two-dimensional array associated with each location of the specimen at the angle.

Example 133 includes the subject matter of any of Examples 95-132, and further specifies that the charged particle microscope includes a scanning electron microscope (SEM), a transmission electron microscope (TEM), a scanning transmission electron microscope (STEM), or a cryo-electron microscope (cryoEM).

Example 134 includes the subject matter of any of Examples 95-133, and further specifies that the second logic is to, for each angle of the plurality of angles, generate an associated data set of the specimen by processing electron diffraction data of the specimen at the angle generated by the charged particle microscope in accordance with the associated scan mask.

Example 135 includes the subject matter of Example 134, and further specifies that the electron diffraction data includes position-averaged convergent beam electron diffraction (PACBED) data.

Example 136 includes the subject matter of any of Examples 95-135, and further specifies that, for each angle of the plurality of angles, the associated data set includes cathodoluminescence (CL) data, Raman imaging data, Auger electron spectroscopy (ASE) data, back-scattered electron (BSE) data, or secondary electron (SE) data.

Example 137 includes the subject matter of any of Examples 95-136, and further includes: the charged particle microscope.

Example 138 includes the subject matter of any of Examples 95-137, and further specifies that processing data from a scan, in accordance with the associated scan mask, by a charged particle microscope of the specimen at the angle includes storing data from a scan, in accordance with the associated scan mask, by a charged particle microscope of the specimen at the angle.

Example 139 includes the subject matter of any of Examples 95-138, and further specifies that processing data from a scan, in accordance with the associated scan mask, by a charged particle microscope of the specimen at the angle includes filtering data from a scan, in accordance with the associated scan mask, by a charged particle microscope of the specimen at the angle.

Example 140 includes the subject matter of any of Examples 95-139, and further specifies that processing data from a scan, in accordance with the associated scan mask, by a charged particle microscope of the specimen at the angle includes aligning data associated with a first angle to data associated with a second angle.

Example 141 includes the subject matter of any of Examples 95-140, and further specifies that processing data from a scan, in accordance with the associated scan mask, by a charged particle microscope of the specimen at the angle includes performing elemental analysis on the data from the scan.

Example 142 includes the subject matter of any of Examples 95-141, and further specifies that a scan mask associated with a first angle of the plurality of angles is different than a scan mask associated with a second angle of the plurality of angles that is different from the first angle.

Example 143 is a method including any of the operations performed by any of the charged particle microscope computational support apparatus of any of Examples 1-142.

Example 144 is one or more non-transitory computer-readable media having instructions thereon that, when executed by one or more processing devices of a charged particle microscope computational support apparatus, cause the charged particle microscope computational support apparatus to perform any of the operations of any of the charged particle microscope computational support apparatus of Examples 1-142.

Example 145 is a charged particle microscope computational support apparatus including means for performing any of the operations performed by any of the charged particle microscope computational support apparatus of Examples 1-142.

Example 146 includes of the CPM reconstruction support modules disclosed herein.

Example 147 includes any of the methods disclosed herein.

Example 148 includes any of the graphical user interfaces disclosed herein.

Example 149 includes any of the CPM support computing devices and systems disclosed herein.

The invention claimed is:

1. A charged particle microscope computational support apparatus, comprising:
    first logic to, for each angle of a plurality of angles:
        receive an associated image of a specimen at the angle,
        identify one or more regions-of-interest in the associated image, where in identifying the one or more regions-of-interest in the associated image includes identifying at least one particle in the associated image, and
        generate an associated scan mask based on thee one or more regions-of-interest in the associated image;
    second logic to, for each angle of the plurality of angles, generate an associated data set of the specimen by processing data from a scan, in accordance with the associated scan mask, by a charged particle microscope of the specimen at the angle; and
    third logic to provide, for each angle of the plurality of angles, the associated data set of the specimen to reconstruction logic to generate a three-dimensional reconstruction of the specimen.

2. The charged particle microscope computational support apparatus of claim 1, wherein, for at least one angle of the plurality of angles, the associated data set of the specimen includes at least one zero data region.

3. The charged particle microscope computational support apparatus of claim 1, wherein the data sets of the specimen include energy dispersive spectroscopy (EDS) data, diffraction pattern data, or electron energy loss spectroscopy (EELS) data.

4. The charged particle microscope computational support apparatus of claim 1, further comprising:
    fourth logic to, for each angle of the plurality of angles, cause the charged particle microscope to generate the associated image of the specimen at the angle.

5. The charged particle microscope computational support apparatus of claim 4, wherein, for an individual angle of the plurality of angles, an acquisition time for the generation of the associated image of the specimen at the individual angle is less than an acquisition time for the generation of the associated data set of the specimen at the individual angle in accordance with the associated scan mask.

6. The charged particle microscope computational support apparatus of claim 4, wherein, for an individual angle of the plurality of angles, a radiation dose for the generation of the associated data set of the specimen at the individual angle in accordance with the associated scan mask is less than a radiation dose for the generation of a full frame data set of the specimen at the individual angle.

7. The charged particle microscope computational support apparatus of claim 4, wherein, for an individual angle of the plurality of angles, a resolution of the associated data set of the specimen at the individual angle in accordance with the associated scan mask is less than a resolution of a full frame data set of the specimen at the individual angle.

8. The charged particle microscope computational support apparatus of claim 1, wherein the first logic is to, for an individual angle of the plurality of angles, cause a display device to display a graphical representation of the associated scan mask.

9. The charged particle microscope computational support apparatus of claim 8, wherein the first logic is to, for the individual angle of the plurality of angles, provide instructions to cause a display device to display an image of the specimen at the individual angle concurrently with the display of the graphical representation of the associated scan mask.

10. A charged particle microscope computational support apparatus, comprising:
    first logic to, for each angle of a plurality of angles, generate an associated scan mask for scanning a specimen, wherein a scan mask associated with a first angle of the plurality of angles is different than a scan mask associated with a second angle of the plurality of angles that is different from the first angle; and
    second logic to, for each angle of the plurality of angles, generate an associated data set of the specimen based on a scan by a charged particle microscope of the specimen at the angle in accordance with the associated scan mask;
    wherein:
        for at least on angle of the plurality of angles, the associated data set of the specimen includes at least one zero data region,
        for at least one angle of the plurality of angels, the associated data set of the specimen includes at least one non-zero data region, and
        the at least one non-zero data region has a substantially rectangular boundary.

11. The charged particle microscope computational support apparatus of claim 10, wherein the first logic is to, for an individual angle of the plurality of angles, cause a display device to display a graphical representation of the associated scan mask.

12. The charged particle microscope computational support apparatus of claim 11, wherein the first logic is to, for the individual angle of the plurality of angles, cause a display device to display analytical data of the specimen at the individual angle concurrently with the display of the graphical representation of the associated scan mask.

13. The charged particle microscope computational support apparatus of claim 12, wherein the first logic is to, for the individual angle of the plurality of angles, cause a display device to display (1) an image of the specimen at the individual angle overlaid with a first graphical representation of the associated scan mask, and (2) analytical data of the specimen at the individual angle overlaid with a second graphical representation of the associated scan mask.

14. The charged particle microscope computational support apparatus of claim 10, wherein, for at least one angle of the plurality of angles, the associated data set of the specimen includes a first non-zero data region corresponding to a first portion of the specimen, a second non-zero data region corresponding to a second portion of the specimen, and a zero data region between the first non-zero data region and the second non-zero data region.

15. A charged particle microscope computational support apparatus, comprising:
    first logic to, for each angle of a plurality of angles, generate an associated scan mask for scanning a specimen;
    second logic to, for each angle of the plurality of angles, cause a charged particle microscope to scan the specimen at the angle in accordance with the associated scan mask, and to generate an associated data set of the specimen based on the scan of the specimen at the angle, and wherein the second logic is to, for an individual angle of the plurality of angles, cause a display device to display a graphical representation of an identification of one or more chemical elements present in the specimen at the associated angle; and third logic to provide, for each angle of the plurality of angles, the associated data set of the specimen to reconstruction logic to generate a three-dimensional reconstruction of the specimen.

16. The charged particle microscope computational support apparatus of claim 15, wherein the second logic is to, for the individual angle of the plurality of angles, cause a display device to display a graphical representation of the identification of one or more chemical elements present in the specimen at the associated angle overlaid on an image of the specimen at the associated angle.

17. The charged particle microscope computational support apparatus of claim 15, wherein the charged particle microscope includes a scanning electron microscope (SEM), a transmission electron microscope (TEM), a scanning transmission electron microscope (STEM), or a cryo-electron microscope (cryoEM).

18. The charged particle microscope computational support apparatus of claim 15, wherein processing data from a scan, in accordance with the associated scan mask, by a charged particle microscope of the specimen at the angle includes (1) filtering data from a scan, in accordance with the associated scan mask, by a charged particle microscope of the specimen at the angle or (2) aligning data associated with a first angle to data associated with a second angle.

19. The charged particle microscope computational support apparatus of claim 15, wherein the second logic is to, for the individual angle of the plurality of angles, cause a display device to display a graphical representation of the identification of one or more chemical elements present in the specimen at the associated angle overlaid on an image of the specimen at the associated angle.

20. A charged particle microscope computational support apparatus, comprising:
  first logic to, for each angle of a plurality of angles:
    receive an associated image of a specimen at the angle, and
    generate an associated scan mask based on one or more regions-of-interest in the associated image;
  second logic to, for each angle of the plurality of angles, generate an associated data set of the specimen by processing data from a scan, in accordance with the associated scan mask, by a charged particle microscope of the specimen at the angle;
  third logic to provide, for each angle of the plurality of angles, the associated data set of the specimen to reconstruction logic to generate a three-dimensional reconstruction of the specimen; and
  fourth logic to, for each angle of the plurality of angles, cause the charged particle microscope to generate the associated image of the specimen at the angle, wherein, for an individual angle of the plurality of angles, a radiation dose for the generation of the associated data set of the specimen at the individual angle in accordance with the associated scan mask is less than a radiation dose for the generation of a full frame data set of the specimen at the individual angle.

* * * * *

UNITED STATES PATENT AND TRADEMARK OFFICE
CERTIFICATE OF CORRECTION

PATENT NO. : 11,741,730 B2
APPLICATION NO. : 17/357900
DATED : August 29, 2023
INVENTOR(S) : Pavel Potocek et al.

It is certified that error appears in the above-identified patent and that said Letters Patent is hereby corrected as shown below:

In the Claims

In Column 31, Claim 1, Line 18, delete "thee" and insert -- the --, therefor.

In Column 32, Claim 10, Line 22, delete "on" and insert -- one --, therefor.

Signed and Sealed this
Tenth Day of October, 2023

Katherine Kelly Vidal
*Director of the United States Patent and Trademark Office*